United States Patent
Flaherty et al.

(10) Patent No.: US 10,915,669 B2
(45) Date of Patent: Feb. 9, 2021

(54) HVAC ZONING DEVICES, SYSTEMS, AND METHODS

(71) Applicant: Ademco Inc., Golden Valley, MN (US)

(72) Inventors: James Flaherty, St. Louis Park, MN (US); Nathaniel D. Kraft, Minnetonka, MN (US); Preston Gilmer, Delano, MN (US)

(73) Assignee: Ademco Inc., Golden Valley, MN (US)

( * ) Notice: Subject to any disclaimer, the term of this patent is extended or adjusted under 35 U.S.C. 154(b) by 151 days.

(21) Appl. No.: 14/745,073

(22) Filed: Jun. 19, 2015

(65) Prior Publication Data

US 2015/0369507 A1    Dec. 24, 2015

Related U.S. Application Data

(60) Provisional application No. 62/015,168, filed on Jun. 20, 2014.

(51) Int. Cl.
*G06F 30/13* (2020.01)
*F24F 11/62* (2018.01)
(Continued)

(52) U.S. Cl.
CPC ......... *G06F 30/13* (2020.01); *F24D 19/1084* (2013.01); *F24F 11/30* (2018.01);
(Continued)

(58) Field of Classification Search
CPC ............ F24F 11/006; F24F 2011/0064; F24F 11/0012; F24F 2011/0068
(Continued)

(56) References Cited

U.S. PATENT DOCUMENTS 1,949,101 A    2/1934 Greenewalt
1,950,101 A    3/1934 Dixon
(Continued)

FOREIGN PATENT DOCUMENTS

AU    667634 B2    3/1996
AU    688762 B2    3/1998
(Continued)

OTHER PUBLICATIONS

Venmar, Venmar Air Exchangers, Oct. 22, 2012.*
(Continued)

*Primary Examiner* — David J Teitelbaum
*Assistant Examiner* — Schyler S Sanks
(74) *Attorney, Agent, or Firm* — Shumaker & Sieffert, P.A.

(57) ABSTRACT

A heating, ventilation, and air conditioning (HVAC) system may be zoned into one or more zone. The HVAC system may include HVAC components, sensors, and one or more register vents that may include vent dampers (e.g., electronically controllable vent dampers or manually operated vent dampers). Opening and closing of the vent dampers may facilitate creating zones or sub-zones in the HVAC system configuration. An HVAC control system may receive a request for conditioned air in one or more of the zones, determine a damper setting for at least one of the vent dampers, communicate the determined damper setting to a vent damper or user interface, determine which HVAC components should be active, if any, and/or provide controls signals to activate or keep active the HVAC components that are determined to be active.

21 Claims, 6 Drawing Sheets

(51) Int. Cl.
*F24F 11/70* (2018.01)
*F24D 19/10* (2006.01)
*F24F 11/30* (2018.01)
*F24F 11/64* (2018.01)
*F24F 110/00* (2018.01)
*F24F 110/10* (2018.01)
*F24F 110/20* (2018.01)
*F24F 110/50* (2018.01)
*F24F 130/20* (2018.01)
*F24F 140/40* (2018.01)
*F24F 120/20* (2018.01)
*F24F 11/65* (2018.01)
*F24F 11/56* (2018.01)
*F24F 11/58* (2018.01)
*F24F 11/46* (2018.01)
*F24F 11/52* (2018.01)

(52) U.S. Cl.
CPC .............. *F24F 11/62* (2018.01); *F24F 11/64* (2018.01); *F24F 11/70* (2018.01); *F24F 11/46* (2018.01); *F24F 11/52* (2018.01); *F24F 11/56* (2018.01); *F24F 11/58* (2018.01); *F24F 11/65* (2018.01); *F24F 2110/00* (2018.01); *F24F 2110/10* (2018.01); *F24F 2110/20* (2018.01); *F24F 2110/50* (2018.01); *F24F 2120/20* (2018.01); *F24F 2130/20* (2018.01); *F24F 2140/40* (2018.01)

(58) Field of Classification Search
USPC ........................................................ 236/1 B
See application file for complete search history.

(56) References Cited

U.S. PATENT DOCUMENTS

| | | | |
|---|---|---|---|
| 1,951,101 A | 3/1934 | Miller |
| 5,024,265 A | 6/1991 | Buchholz et al. |
| 5,303,767 A | 4/1994 | Riley |
| 5,305,953 A | 4/1994 | Rayburn et al. |
| 5,318,099 A | 6/1994 | Zivalich et al. |
| 5,337,955 A | 8/1994 | Burd |
| 5,344,068 A | 9/1994 | Haessig et al. |
| 5,348,078 A | 9/1994 | Dushane et al. |
| 5,394,324 A | 2/1995 | Clearwater et al. |
| 5,415,346 A | 5/1995 | Bishop |
| 5,447,037 A | 9/1995 | Bishop et al. |
| 5,449,112 A | 9/1995 | Heitman et al. |
| 5,449,319 A | 9/1995 | Dushane et al. |
| 5,495,887 A | 3/1996 | Kathnelson et al. |
| 5,520,328 A | 5/1996 | Bujak, Jr. |
| 5,651,264 A | 7/1997 | Lo et al. |
| 5,704,545 A | 1/1998 | Sweitzer, Jr. |
| 5,751,572 A | 5/1998 | Maciulewicz et al. |
| 5,768,121 A | 6/1998 | Federspiel et al. |
| 5,810,245 A | 9/1998 | Heitman et al. |
| 5,829,674 A | 11/1998 | Vanostrand et al. |
| 5,833,134 A | 11/1998 | Ho et al. |
| 5,839,654 A | 11/1998 | Weber et al. |
| 5,860,473 A | 1/1999 | Seiden |
| 5,882,254 A | 3/1999 | Jacob et al. |
| 5,927,398 A | 7/1999 | Maciulewicz et al. |
| 5,944,098 A | 8/1999 | Jackson et al. |
| 5,962,989 A | 10/1999 | Baker |
| 5,983,890 A | 11/1999 | Martin et al. |
| 6,021,252 A | 2/2000 | Faris et al. |
| 6,079,626 A | 6/2000 | Hartman et al. |
| 6,102,792 A | 8/2000 | Nystrom |
| 6,213,404 B1 | 4/2001 | Dushane et al. |
| 6,216,956 B1 | 4/2001 | Ehlers et al. |
| 6,219,590 B1 | 4/2001 | Bernaden, III et al. |
| 6,237,854 B1 | 5/2001 | Avni |
| 6,295,823 B1 | 10/2001 | Odom et al. |
| 6,296,193 B1 | 10/2001 | West et al. |
| 6,349,883 B1 | 2/2002 | Simmons et al. |
| 6,364,211 B1 | 4/2002 | Saleh |
| 6,574,581 B1 | 6/2003 | Bohrer et al. |
| 6,575,233 B1 | 6/2003 | Krumnow |
| 6,659,359 B2 | 12/2003 | Kwak |
| 6,676,508 B1 | 1/2004 | Graham |
| 6,688,384 B2 | 2/2004 | Eoga |
| 6,692,349 B1 | 2/2004 | Brinkerhoff et al. |
| 6,741,915 B2 | 5/2004 | Poth |
| 6,879,881 B1 | 4/2005 | Attridge, Jr. |
| 6,983,889 B2 | 1/2006 | Alles |
| 6,986,469 B2 | 1/2006 | Gauthier et al. |
| 6,997,390 B2 | 2/2006 | Alles |
| 7,003,378 B2 | 2/2006 | Poth |
| 7,055,759 B2 | 6/2006 | Wacker et al. |
| 7,063,140 B1 | 6/2006 | Woo |
| 7,130,720 B2 | 10/2006 | Fisher |
| 7,147,168 B1 | 12/2006 | Bagwell et al. |
| 7,156,316 B2 | 1/2007 | Kates |
| 7,163,156 B2 | 1/2007 | Kates |
| 7,168,627 B2 | 1/2007 | Kates |
| 7,222,494 B2 | 5/2007 | Peterson et al. |
| 7,222,800 B2 | 5/2007 | Wruck |
| 7,261,241 B2 | 8/2007 | Eoga |
| 7,392,661 B2 | 7/2008 | Alles |
| 7,455,236 B2 | 11/2008 | Kates |
| 7,455,237 B2 | 11/2008 | Kates |
| 7,548,833 B2 | 6/2009 | Ahmed |
| 7,551,983 B2 | 6/2009 | Attridge, Jr. |
| 7,601,054 B2 | 10/2009 | Bagwell et al. |
| 7,606,635 B2 | 10/2009 | Fisher |
| 7,693,591 B2 | 4/2010 | Hoglund et al. |
| 7,726,582 B2 | 6/2010 | Federspiel |
| 7,788,936 B2 | 9/2010 | Peterson et al. |
| 7,809,472 B1 | 10/2010 | Silva et al. |
| 7,832,465 B2 | 11/2010 | Zou et al. |
| 7,880,421 B2 | 2/2011 | Karwath |
| 7,904,209 B2 | 3/2011 | Podgomy et al. |
| 7,957,839 B2 | 6/2011 | Takach et al. |
| 7,983,796 B2 | 7/2011 | Kassel |
| 8,010,237 B2 | 8/2011 | Cheung et al. |
| 8,014,902 B2 | 9/2011 | Kates |
| 8,020,777 B2 | 9/2011 | Kates |
| 8,024,073 B2 | 9/2011 | Imes et al. |
| 8,033,479 B2 | 10/2011 | Kates |
| 8,038,075 B1 | 10/2011 | Walsh |
| 8,078,325 B2 | 12/2011 | Poth |
| 8,086,352 B1 | 12/2011 | Elliott |
| 8,090,477 B1 | 1/2012 | Steinberg |
| 8,108,076 B2 | 1/2012 | Imes et al. |
| 8,112,181 B2 | 2/2012 | Remsburg |
| 8,116,913 B2 | 2/2012 | Mirpourian et al. |
| 8,143,828 B2 | 3/2012 | Becerra et al. |
| 8,147,302 B2 | 4/2012 | Desrochers et al. |
| 8,167,216 B2 * | 5/2012 | Schultz .................. F24F 11/006 236/1 B |
| 8,185,244 B2 | 5/2012 | Wolfson |
| 8,190,301 B2 | 5/2012 | Voysey |
| 8,209,059 B2 | 6/2012 | Stockton |
| 8,219,252 B2 | 7/2012 | Nanami |
| 8,224,490 B2 | 7/2012 | Knyazev |
| 8,224,491 B2 | 7/2012 | Koster et al. |
| 8,229,596 B2 | 7/2012 | Mejias |
| 8,369,995 B2 | 2/2013 | Nanami |
| 8,387,892 B2 | 3/2013 | Koster et al. |
| 8,397,527 B2 | 3/2013 | Miller |
| 8,417,386 B2 | 4/2013 | Douglas et al. |
| 8,418,128 B2 | 4/2013 | Pouchak et al. |
| 8,495,888 B2 | 7/2013 | Seem |
| 8,515,584 B2 | 8/2013 | Miller et al. |
| 8,543,244 B2 | 9/2013 | Keeling et al. |
| 8,550,370 B2 | 10/2013 | Barrett et al. |
| 8,555,662 B2 | 10/2013 | Peterson et al. |
| 8,579,205 B2 | 11/2013 | Augusto et al. |
| 8,651,391 B2 | 2/2014 | Patch |
| 8,660,708 B2 | 2/2014 | Narayanamurthy et al. |
| 8,661,165 B2 | 2/2014 | Grohman et al. |
| 8,695,888 B2 | 4/2014 | Kates |

(56) References Cited

U.S. PATENT DOCUMENTS

| | | | |
|---|---|---|---|
| 8,702,482 B2 | 4/2014 | Helt et al. | |
| 8,963,726 B2 | 2/2015 | Kates | |
| 8,963,727 B2 | 2/2015 | Kates | |
| 8,963,728 B2 | 2/2015 | Kates | |
| 8,981,950 B1 | 3/2015 | Kates | |
| 9,007,225 B2 | 4/2015 | Kates | |
| 9,019,110 B2 | 4/2015 | Kates | |
| 9,182,140 B2 | 11/2015 | Kates | |
| 9,183,733 B2 | 11/2015 | Kates | |
| 9,194,599 B2 | 11/2015 | Kates | |
| 9,194,600 B2 | 11/2015 | Kates | |
| 9,222,692 B2 | 12/2015 | Kates | |
| 10,151,502 B2 | 12/2018 | Flaherty et al. | |
| 2001/0048030 A1 | 12/2001 | Sharood et al. | |
| 2002/0123896 A1 | 9/2002 | Diez et al. | |
| 2003/0014161 A1 | 1/2003 | Orthlieb et al. | |
| 2003/0200050 A1 | 10/2003 | Sharma | |
| 2004/0118933 A1 | 6/2004 | Readio et al. | |
| 2004/0166797 A1 | 8/2004 | Thrasher et al. | |
| 2004/0194484 A1 | 10/2004 | Zou et al. | |
| 2005/0090915 A1 | 4/2005 | Geiwitz | |
| 2005/0127196 A1 | 6/2005 | Gottlieb | |
| 2005/0155365 A1 | 7/2005 | Shah et al. | |
| 2005/0156049 A1 | 7/2005 | Van Ostrand et al. | |
| 2005/0156050 A1 | 7/2005 | Shah et al. | |
| 2005/0159848 A1 | 7/2005 | Shah et al. | |
| 2005/0173548 A1 | 8/2005 | Kramer | |
| 2005/0194456 A1 | 9/2005 | Tessier et al. | |
| 2005/0270151 A1 | 12/2005 | Winick | |
| 2005/0278071 A1 | 12/2005 | Durham | |
| 2005/0279845 A1 | 12/2005 | Bagwell et al. | |
| 2005/0284622 A1* | 12/2005 | Nichols | F24F 11/006 165/205 |
| 2006/0036350 A1 | 2/2006 | Bohrer et al. | |
| 2006/0071087 A1 | 4/2006 | Kates | |
| 2006/0099904 A1 | 5/2006 | Belt et al. | |
| 2006/0185275 A1 | 8/2006 | Yatt | |
| 2006/0185373 A1 | 8/2006 | Butler et al. | |
| 2007/0012052 A1 | 1/2007 | Butler et al. | |
| 2007/0023533 A1 | 2/2007 | Liu | |
| 2007/0045431 A1 | 3/2007 | Chapman et al. | |
| 2007/0051822 A1 | 3/2007 | Wolfson | |
| 2007/0119958 A1 | 5/2007 | Kates | |
| 2007/0228183 A1 | 10/2007 | Kennedy et al. | |
| 2008/0011864 A1 | 1/2008 | Tessier et al. | |
| 2008/0033599 A1* | 2/2008 | Aminpour | F24F 11/006 700/276 |
| 2008/0054083 A1 | 3/2008 | Evans | |
| 2008/0099568 A1 | 5/2008 | Nicodem et al. | |
| 2008/0133033 A1 | 6/2008 | Wolff et al. | |
| 2008/0161976 A1 | 7/2008 | Stanimirovic | |
| 2008/0179053 A1 | 7/2008 | Kates | |
| 2008/0208654 A1 | 8/2008 | Nahikian et al. | |
| 2008/0251590 A1 | 10/2008 | Arneson | |
| 2009/0008463 A1 | 1/2009 | Holland et al. | |
| 2009/0065595 A1 | 3/2009 | Kates | |
| 2009/0140064 A1 | 6/2009 | Schultz et al. | |
| 2009/0166442 A1 | 7/2009 | Stark | |
| 2009/0204262 A1* | 8/2009 | Nishimura | F24F 11/006 700/276 |
| 2009/0266904 A1 | 10/2009 | Cohen | |
| 2009/0271154 A1 | 10/2009 | Coad et al. | |
| 2010/0012737 A1 | 1/2010 | Kates | |
| 2010/0045470 A1 | 2/2010 | Araiza et al. | |
| 2010/0082162 A1 | 4/2010 | Mundy et al. | |
| 2010/0084482 A1 | 4/2010 | Kennedy et al. | |
| 2010/0106334 A1 | 4/2010 | Grohman et al. | |
| 2010/0163633 A1* | 7/2010 | Barrett | B60H 1/00871 236/49.3 |
| 2010/0168924 A1 | 7/2010 | Tessier et al. | |
| 2010/0204834 A1 | 8/2010 | Comerford et al. | |
| 2010/0307733 A1 | 12/2010 | Karamanos et al. | |
| 2011/0015802 A1 | 1/2011 | Imes | |
| 2011/0031322 A1 | 2/2011 | Zou et al. | |
| 2011/0034120 A1 | 2/2011 | Jaiyeola | |
| 2011/0040550 A1 | 2/2011 | Graber et al. | |
| 2011/0046798 A1 | 2/2011 | Imes et al. | |
| 2011/0046799 A1 | 2/2011 | Imes et al. | |
| 2011/0054701 A1 | 3/2011 | Wang et al. | |
| 2011/0062246 A1 | 3/2011 | Khalafi | |
| 2011/0112875 A1 | 5/2011 | Johnson et al. | |
| 2011/0127340 A1 | 6/2011 | Aiken | |
| 2011/0172828 A1 | 7/2011 | Schmidt et al. | |
| 2011/0198404 A1 | 8/2011 | Dropmann | |
| 2011/0202185 A1 | 8/2011 | Imes et al. | |
| 2011/0214060 A1 | 9/2011 | Imes et al. | |
| 2011/0246898 A1 | 10/2011 | Imes et al. | |
| 2011/0257795 A1 | 10/2011 | Narayanamurthy et al. | |
| 2011/0270446 A1 | 11/2011 | Scharf et al. | |
| 2011/0276183 A1 | 11/2011 | Liu | |
| 2012/0041603 A1 | 2/2012 | Wilmsen et al. | |
| 2012/0048952 A1 | 3/2012 | Slingsby et al. | |
| 2012/0072030 A1 | 3/2012 | Elliott | |
| 2012/0072031 A1 | 3/2012 | Elliott | |
| 2012/0072033 A1 | 3/2012 | Imes et al. | |
| 2012/0101637 A1 | 4/2012 | Imes et al. | |
| 2012/0101648 A1 | 4/2012 | Federspiel et al. | |
| 2012/0116728 A1 | 5/2012 | Shear et al. | |
| 2012/0161682 A1 | 6/2012 | Becerra et al. | |
| 2012/0217315 A1 | 8/2012 | Witbeck et al. | |
| 2012/0221718 A1 | 8/2012 | Imes et al. | |
| 2012/0228393 A1 | 9/2012 | Storm et al. | |
| 2012/0239202 A1 | 9/2012 | Voysey | |
| 2012/0239208 A1 | 9/2012 | Federspiel et al. | |
| 2012/0253524 A1 | 10/2012 | Norrell et al. | |
| 2012/0298763 A1 | 11/2012 | Young | |
| 2012/0310416 A1 | 12/2012 | Tepper et al. | |
| 2013/0054033 A1 | 2/2013 | Casilli | |
| 2013/0057937 A1 | 3/2013 | Berman et al. | |
| 2013/0069541 A1 | 3/2013 | Feri et al. | |
| 2013/0081799 A1 | 4/2013 | Loblich et al. | |
| 2013/0085613 A1 | 4/2013 | Bester et al. | |
| 2013/0138249 A1 | 5/2013 | Cho et al. | |
| 2013/0138250 A1 | 5/2013 | Mowery et al. | |
| 2013/0182905 A1 | 7/2013 | Myers et al. | |
| 2013/0245838 A1 | 9/2013 | Zywicki et al. | |
| 2013/0268129 A1 | 10/2013 | Fadell et al. | |
| 2013/0297078 A1 | 11/2013 | Kolavennu | |
| 2013/0310986 A1 | 11/2013 | Gust et al. | |
| 2013/0310987 A1 | 11/2013 | Sobek et al. | |
| 2013/0334326 A1 | 12/2013 | Shan | |
| 2013/0338837 A1 | 12/2013 | Hublou et al. | |
| 2013/0338839 A1 | 12/2013 | Rogers et al. | |
| 2014/0000861 A1 | 1/2014 | Barrett et al. | |
| 2014/0031993 A1 | 1/2014 | Matsuoka | |
| 2014/0034284 A1 | 2/2014 | Butler et al. | |
| 2014/0041846 A1 | 2/2014 | Leen et al. | |
| 2014/0052300 A1 | 2/2014 | Matsuoka et al. | |
| 2014/0067130 A1 | 3/2014 | Pillai et al. | |
| 2014/0101082 A1 | 4/2014 | Matsuoka et al. | |
| 2014/0319232 A1 | 10/2014 | Gourlay et al. | |
| 2015/0057810 A1 | 2/2015 | Smith et al. | |
| 2015/0369503 A1 | 12/2015 | Flaherty et al. | |
| 2015/0369504 A1 | 12/2015 | Flaherty et al. | |
| 2015/0369507 A1 | 12/2015 | Flaherty et al. | |
| 2018/0023826 A1 | 1/2018 | Tucker et al. | |
| 2018/0032969 A1 | 2/2018 | Gillette et al. | |

FOREIGN PATENT DOCUMENTS

| | | |
|---|---|---|
| AU | 2005294681 A1 | 4/2006 |
| AU | 2009231670 A1 | 10/2009 |
| AU | 2008229674 A1 | 4/2010 |
| AU | 2010276364 A2 | 8/2012 |
| AU | 2010284375 B2 | 10/2014 |
| CA | 1326705 C | 2/1994 |
| CA | 2005497 C | 5/1994 |
| CA | 2077199 C | 8/1997 |
| CA | 2025279 C | 5/1998 |
| CA | 2582232 A1 | 4/2006 |
| CA | 2599471 A1 | 2/2009 |
| CA | 2748724 A1 | 7/2010 |
| CA | 2699034 A1 | 8/2010 |
| CA | 2698794 A1 | 9/2010 |

(56) References Cited

FOREIGN PATENT DOCUMENTS

| | | |
|---|---|---|
| CA | 2677047 A1 | 11/2010 |
| CA | 2668812 A1 | 12/2010 |
| CA | 2768799 A1 | 1/2011 |
| CA | 2771280 A1 | 2/2011 |
| CA | 2771638 A1 | 2/2011 |
| CA | 2818696 A1 | 5/2012 |
| CA | 2769288 A1 | 9/2012 |
| CA | 2798477 A1 | 6/2013 |
| CA | 2719932 C | 10/2013 |
| CA | 2698845 C | 11/2013 |
| CN | 101048624 A | 10/2007 |
| CN | 101145276 A | 3/2008 |
| CN | 101194129 B | 10/2010 |
| CN | 101999252 A | 3/2011 |
| CN | 202328615 U | 7/2012 |
| CN | 102882752 A | 1/2013 |
| CN | 103229116 A | 7/2013 |
| DE | 10126475 A1 | 3/2003 |
| DK | 201200174 A | 9/2013 |
| EP | 0660051 A2 | 6/1995 |
| EP | 0632234 B1 | 3/1998 |
| EP | 0721089 B1 | 8/2000 |
| EP | 0892330 B1 | 10/2002 |
| EP | 0889291 B1 | 4/2004 |
| EP | 2014994 A2 | 1/2009 |
| EP | 2690372 A2 | 1/2014 |
| GB | 2452345 A | 3/2009 |
| GB | 2477860 A | 8/2011 |
| JP | 2002245102 A | 8/2002 |
| JP | 2003287240 A | 10/2003 |
| JP | 2006300484 A | 11/2006 |
| JP | 2012078049 A | 4/2012 |
| WO | 2006041599 A2 | 4/2006 |
| WO | 2006099125 A2 | 9/2006 |
| WO | 2007027632 A2 | 3/2007 |
| WO | 2008016500 A2 | 2/2008 |
| WO | 2008030791 A2 | 3/2008 |
| WO | 2009073034 A1 | 6/2009 |
| WO | 2009124217 A1 | 10/2009 |
| WO | 2010078459 A1 | 7/2010 |
| WO | 2011011404 A1 | 1/2011 |
| WO | 2011022379 A1 | 2/2011 |
| WO | 2011062942 A1 | 5/2011 |
| WO | 2011100736 A2 | 8/2011 |
| WO | 2011120091 A1 | 10/2011 |
| WO | 2012068591 A2 | 5/2012 |
| WO | 2012092622 A2 | 7/2012 |
| WO | 2012092625 A2 | 7/2012 |
| WO | 2012092627 A1 | 7/2012 |
| WO | WO 2012092625 A2 * 7/2012 ............ F24F 11/006 |
| WO | 2012112415 A1 | 8/2012 |
| WO | 2013043863 A1 | 3/2013 |
| WO | 2013173433 A1 | 11/2013 |
| WO | 2013179080 A1 | 12/2013 |
| WO | 2014033189 A1 | 3/2014 |
| WO | 2014051632 A1 | 4/2014 |

OTHER PUBLICATIONS

Tekmar, Tekmar Control Systems, Discover the Benefits of Hydronic Heating or Cooling, Nov. 26, 2012.*
Arzel Zoning Technology, Inc., "Zonocity: Zoning for Small Duct High Velocity Applications (SDHV)," http://www.arelzoning.com/products/zonocity, 2 pages, printed Jun. 17, 2014.
Brown, "Multizone Register Controlled Residential Heating: Optimized for Energy Use and Comfort," Center for the Built Environment, UC Berkeley, 62 pages, 2007.
Carrier, "A 6-in-1 Device: Intelligent Residential Control Introduced by Carrier," http://www.transicold.carrier.com/Carrier+Corporate+Sites/Corporate/Side+Bar+ULinks/Global+News/ci.A+6-in-1+Device%3A+Intelligent+Residentiai+Control . . . , 3 pages, May 29, 2014.
Carrier, Carrier Comfort System (VVTIII), 6 pages, Aug. 1996.
Carrier, "VVT Comfort System, 33 CS," 6 pages, Oct. 1997.
Dounis Et al., "Advanced Control Systems Engineering for Energy and Comfort Management in a Building Environment—A Review," Renewable and Sustainable Energy Reviews, vol. 13, pp. 1246-1261, 2009.
Home Climate Control, "Technical FAQ: HVAC: Excess Static Pressure Relief," http://www.homeclimatecontrol.com/faq/technical-hvac-excess-static-pressure-relief, 5 pages, printed, May 19, 2014.
Honeywell, "WiFi Color Touchscreen Programmable Thermostat, RTH9590 WiFi With Voice Control, Quick Start Guide," 20 pages, Feb. 2014.
http://www.linkedin.com/groups/JCI-new-ASSET-tool-is-4767612. S.198141514, "JCI New Asset Tool is a Game Changer," 2 pages, printed Jun. 17, 2014.
http://www.statscrop.com/www/theactivent.com, "Theactivent. com, The Activent, Web Analysis," 5 pages, printed May 16, 2014.
https://developer.apple.com/homekit/, "HomeKit, Apple Developer," 2 pages, printed Jan. 21, 2016.
https://web.archive.org/web/20040609142352/http://diy-zoning. sourceforge.net/Advanced/dampers.html, "DIY Zoning: Dampers," 2 pages, Jun. 9, 2004.
https://web.archive.org/web/20040613050818/http://www. smarthomeusa.com/Shop/Climate/rcs/RCS-Zone-Controllers/Item/ZC6R-232/, "RCS HVAC 6 Zone Controller (RS-232 Version)—ZC6R-232—SmartHomeUSA.com," 2 pages, Jun. 13, 2004.
https://web.archive.org/web/20040624153603/http://diy-zoning. sourceforge.net/Development/contract.html, "DIY Zoning: Design Contract," 2 pages, Jun. 24, 2004.
https://web.archive.org/web/20081204093741/http://www.smarthome. com'3096H146/In-Wall-Motorized-Registers/p.aspx, "In-Wall Motorized Registers—Smarthome," 2 pages, Dec. 4, 2008.
https://web.archive.org/web/20130724192824/http://diy-zoning. sourceforge.net/Advanced/dampers.html, "DIY Zoning: Dampers," 4 pages, Jul. 24, 2013.
https:www.webarchive.org/web/20080602013118/http://www. commercial.carrier.com/commercial/hvac/productdescription/1,3059,CLI1_DIV12 ETI434_PRD189.00 . . . , "Carrier: 33ZCFANTRM VAV Fan Terminal Zone Controller," 6 pages, Jun. 2008.
Jackson Systems, "Comfort System VAV Diffuser," 2 pages, downloaded May 19, 2014.
Johnson Controls, "Facility Explorer ASSET Application/System Selection & Estimating Tool," 2 pages, 2012.
Nova, "Activent Electronic Room Temperature Regulator, User Manual and Installation Guide," 7 pages, downloaded May 16, 2014.
Redfern et al., "Design Architecture for Multi-Zone HVAC Control Systems From Existing Single-Zone Systems Using Wireless Sensor Networks," Proceedings of SPIE, vol. 6414, 2007.
Residential Control Systems Inc., "RCS Model ZC6R, 6 Zone HVAC Control Unit," 2 pages, Feb. 2002.
Siemens, "HIT: Online Version Supports Energy Efficiency Standard," Press Release, 2 pages, Feb. 20, 2009.
Telkonet, "EcoWave Remote Thermostat Package," 2 pages, Jan. 2013.
The Activent, "Individual Room Zoning Systems," http://www. theactivent.com/, 2 pages, printed May 16, 2014.
Trane, "Light Commercial Integrated Comfort System," 6 pages, 2004.
Trane, "Light Commercial Integrated Comfort System," 6 pages, 2001.
Trane, "VariTrac Central Control Panel, Intallation Manual, VAV-SVNO3A-EN," 72 pages, Jun. 2002.
Trane, "VariTrane Products," VAV-PRC008-EN, 308 pages, Mar. 2003.
Trane, "VariTrane Products," VAV-PRC008-EN, 321 pages, May 2006.
Vadim Tkachenko, "DIY Zoning: Design Contract," 3 pages, 2000.

* cited by examiner

HVAC ZONING DEVICES, SYSTEMS, AND METHODS

This application claims the benefit of U.S. Provisional Application Ser. No. 62/015,168, filed Jun. 20, 2014, entitled "HVAC Zoning Devices, Systems, and Methods", which is incorporated herein by reference.

TECHNICAL FIELD

The present disclosure relates generally to HVAC systems, and more particularly, to HVAC systems that can be configured to accommodate zone control.

BACKGROUND

Heating, ventilation, and/or air conditioning (HVAC) systems are often used to control the comfort level within a building or other structure. Such HVAC systems typically include an HVAC controller that controls various HVAC components of the HVAC system in order to affect and/or control one or more environmental conditions within the building. Such HVAC controllers typically have a user interface for allowing a user to interact and the HVAC controller. The user interface is often integral with the HVAC controller housing, but in some instances, can be remote from the HVAC controller, such as when using a user interface of a smart phone, tablet computer, personal computer, laptop etc.

SUMMARY

The present disclosure relates generally to HVAC systems, and more particularly, to HVAC systems that can be configured to accommodate zone control.

In one example, an HVAC system may include one or more HVAC components for providing conditioned air to one or more HVAC ducts of the building and a plurality of electronically controllable register vent dampers for controlling delivery of the conditioned air from the one or more HVAC ducts into the building. In some cases, each of the plurality of electronically controllable register vents may be configured to sense one or more local conditions in the building and issue one or more requests for conditioned air. The HVAC system may be controlled by an HVAC control system and may include, among other elements, a communications block and a controller operatively coupled to the communications block. The communications block may receive one or more requests for conditioned air issued by one or more of the plurality of register vents and thus, the controller may receive the one or more requests for conditioned air. In response to the requests, the controller may determine a damper setting for at least one of the plurality of electronically controllable register vent dampers and communicate the determined damper setting for the at least one of the plurality of electronically controllable register vent dampers via the communications block. In some instances, the controller may determine which HVAC components should be active, if any, to accommodate the requests and provide one or more control signals to activate or keep active the one or more HVAC components that are to be active.

In some cases, the HVAC control system configured to control the HVAC system may include two or more sensors to sense environmental parameters at two or more different locations in the building. At least one of the two or more sensors may sense an environmental parameter other than temperature (e.g., humidity, $CO_2$ concentration, VOC concentration, or other parameter other than temperature). In such cases, the controller may control one or more HVAC components and electronically controllable register vent dampers based, at least in part, on the sensed environmental parameter other than temperature.

In some instances, the HVAC system may include one or more HVAC components for providing conditioned air to one or more HVAC ducts of a building and a plurality of electronically controllable register vent dampers for controlling delivery of conditioned air from the one or more HVAC ducts into each of two or more zones of the building. Each of the zones of the building may have at least one sensor for sensing a sensed condition in the corresponding zone.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments in connection with the accompanying drawings, in which.

Figure 1:
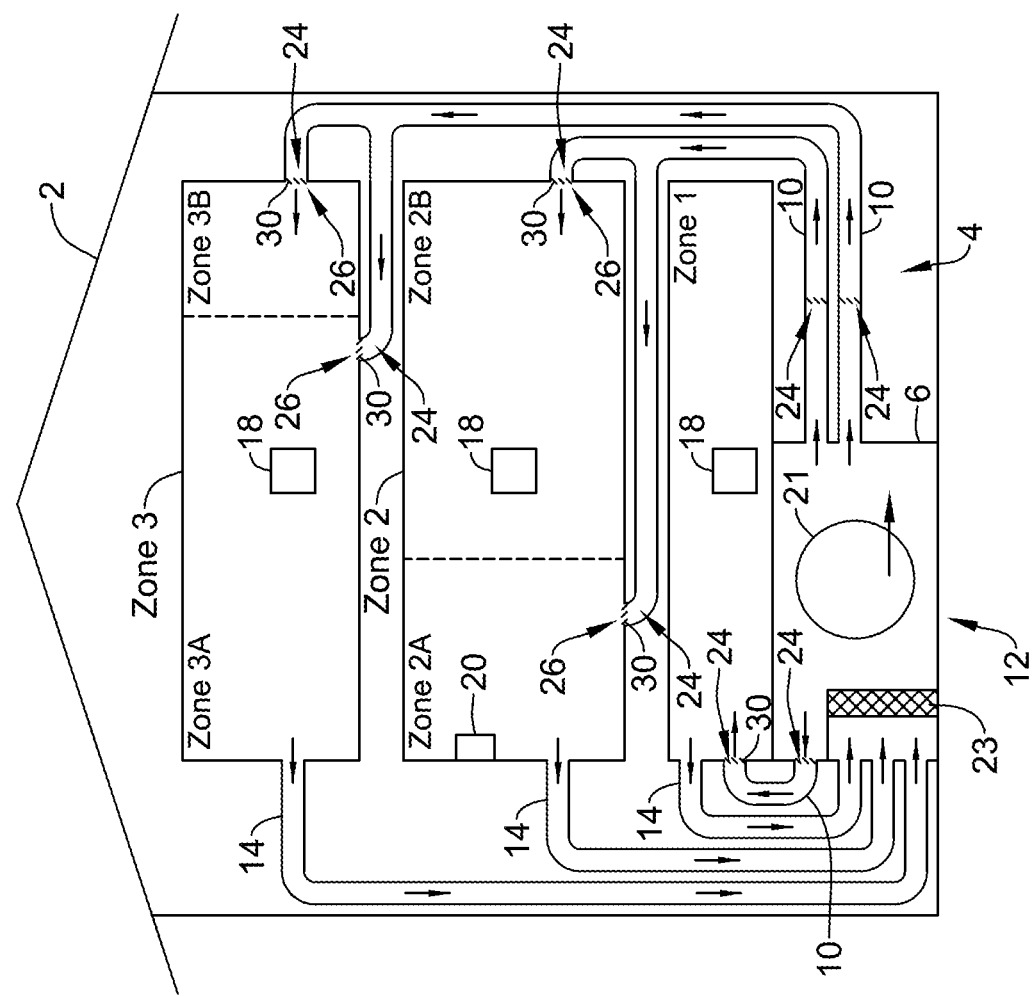
FIG. 1 is a schematic view of an illustrative HVAC system servicing a building or structure.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements throughout the several views. The description and drawings show several embodiments which are meant to be illustrative in nature.

FIG. 1 is a schematic view of a building 2 having an illustrative building automation system 4 with a building automation sub-system 12. While FIG. 1 shows a typical forced air type HVAC system as an illustrative building automation sub-system 12, other building automation sub-systems 12 (e.g., devices or systems at least partially local to a space conditioned by the HVAC system or other building automation sub-systems 12) are contemplated including, but not limited to, security systems, lighting control systems, water heater systems (e.g., boiler systems), refrigerators, clothes washers, clothes dryers, ovens, garage doors, radiant heating systems, electric heating systems, cooling systems, heat pump systems, register vent systems, any other suitable sub-system 12 of building automation systems 4, and/or portions thereof, as desired.

In some instances, the building automation system 4 may include and/or be in communication with a remote system 36 (see FIG. 4 and description in greater detail below). The remote system 36 may be a system that is remote from one or more components of a building automation controller 18 and/or physically remote from the building 2. In some cases, the remote system 36 may, at least partially, reside on one or more servers located in the cloud and remote from the building 2, where the one or more servers may include a memory and a processor configured to execute instructions stored on the memory and/or stored on other memory.

An HVAC system of building 2 may be controlled by an HVAC control system implemented in one or more of a wall mounted thermostat, an equipment interface module, a remote system 36 (e.g., cloud server) or other device. The HVAC control system may include a communications block and a controller operatively coupled to the communications block. The communications block may receive information from the HVAC system and the controller may receive the information and in response, use the information in analyses, to make determinations, to provide recommendations to a user interface, and/or to provide control signals to the HVAC system. In some cases, the HVAC control system (e.g., a building control system) may include a building automation controller 18, a remote system 36, and/or other controller.

The illustrative HVAC system of FIG. 1 may include one or more HVAC components 6, a system of ductwork and air vents including a supply air duct 10 and a return air duct 14, and one or more building automation controllers 18 (e.g., central HVAC controllers, thermostats, etc.), where an HVAC component 6 may provide conditioned air to one or more HVAC supply air ducts 10. The one or more HVAC components 6 may include, but are not limited to, a fan, a portable electric fan, a ceiling fan, a furnace (e.g., a forced air furnace or other furnace), a boiler, a hot water heater, a heat pump, an electric heat pump, a geothermal heat pump, an electric heater, a fireplace, a floor heater, an air conditioning unit, a window air conditioning unit, a wall air conditioning unit, hydronic heating and/or cooling unit/components, a humidifier, a dehumidifier, an air exchanger, an air cleaner, a register vent, a damper, a register vent damper to change air flow characteristics of an associated register (e.g., one or more manually operated register vent dampers and/or one or more electronically controlled register vent dampers), a valve, a ventilation unit for bringing in outside air into the building and exhausting inside air from the building, UV lamps, air purification systems, air cleaning systems, and/or the like.

In some instances, one or more of the HVAC components 6 (e.g., hydronic heating, electric heating strips, etc.) may be utilized in a stage with one or more other HVAC components 6 (e.g., in a forced air heating system, etc.). In an example, electric heating strips may be a stage in a heat pump system, where the electric heating strips may supplement the heat pump system when outdoor temperatures become too cold.

In some cases, combinations of HVAC components 6 may be used to provide quicker response times in reaching a set point than if only a single HVAC component 6 or system is used. Faster response times may be particularly noticeable when manually changing the setpoint temperature or when recovering from a programmed setback temperature, particularly when using a hydronic or other heating system that has a slower response time.

It is contemplated that a building automation controller(s) 18 may be configured to activate, deactivate, and/or otherwise modulate the building automation sub-system(s) 12 (e.g., the HVAC system) or components of the building automation sub-system(s) 12 (e.g., HVAC components 6) of the building automation system 4 in a controlled manner (e.g., to control the comfort level in in one or more spaces of the structure or building 2 and/or otherwise operate electronic features of the building 2 and provide suggestions for manual configuration of manually adjustable devices). The building automation controller(s) 18 may be configured to control the devices of the building automation system 4 or building automation sub-systems 12 via a wired or wireless communication link 20.

In some cases, the building automation controller(s) 18 may be or may include a thermostat, such as, for example, a wall mountable thermostat or intelligent power switch (e.g., for controlling appliances not equipped with communications capabilities and other appliances), but this is not required in all instances. An example thermostat may include (e.g. within the thermostat housing), or have access to, a temperature sensor for sensing an ambient temperature at, near, or spaced from the thermostat and/or other sensors for sensing other comfort level conditioning parameters (e.g., humidity, occupancy, sound, light, particle levels, etc.). In some instances, the building automation controller(s) 18 may be or may include an equipment interface module (EIM), a zone controller, or multiple EIMs or zone controllers each monitoring and/or controlling the comfort level within a particular zone or space (e.g., a comfort level conditioned space) in the building 2 or other structure.

In the illustrative building automation system 4 shown in FIG. 1, the HVAC component(s) 6 (e.g., components of or in communication with the building automation controller 18 or building automation sub-system 12) may provide heated air (and/or cooled air) via the ductwork 10, 14 throughout the building 2. As illustrated, the HVAC component(s) 6 may be in fluid communication with every room and/or zone in the building 2 via the ductwork 10 and 14, but this is not required. In operation, when a heat call or command signal is provided by the building automation controller(s) 18, an HVAC component 6 (e.g. forced warm air from a furnace) may be activated to supply heated air to one or more rooms and/or zones within the building 2 via supply air ducts 10. The heated air may be forced through the supply air duct 10 by a blower or fan 21. In this example, the cooler air from each zone may be returned to the HVAC component 6 for heating via return air ducts 14. Similarly, when a cool call or command signal is provided by the building automation controller(s) 18, an HVAC component 6 (e.g. an air conditioning unit) may be activated to supply cooled air to one or more rooms and/or zones within the building 2 or other structure via supply air ducts 10. The cooled air may be forced through the supply air duct 10 by the blower or fan 21. In this example, the warmer air from each zone may be returned to the HVAC component 6 (e.g. air conditioning unit) for cooling via return air ducts 14. In some cases, the wired or wireless communication link 20 of the building automation system 4 may include an internet gateway (e.g., a modem or other device facilitating a communication link) or other device that may allow one or more of the HVAC components 6, as described herein, to communicate over a wide area network (WAN) such as, for example, the Internet, and/or a device (e.g., wired or wireless communication link 20) that may allow one or more HVAC components 6 to communicate over any other network.

In many instances, one or more air filters 23 may be used to remove dust and other pollutants from the air inside the building 2. In the illustrative example shown in FIG. 1, the air filter(s) 23 are installed in the return air duct 14, and may filter the air prior to the air entering the HVAC component 6, but it is contemplated that any other suitable location for the air filter(s) 23 may be used. The presence of the air filter(s) 23 may not only improve the indoor air quality, but may also protect the HVAC components 6 from dust and other particulate matter that would otherwise be permitted to enter the HVAC component 6.

In some cases, the system of vents or ductwork 10 and/or 14 may include one or more dampers 24 to regulate the flow of air through the vent, but this is not required. The dampers 24 may be positioned along the ductwork 10 and/or 14 at any location. One or more active dampers 24 may be coupled (e.g., in a wired or wireless manner) to one or more HVAC controller(s) 18, EIMs, or zone controllers and may be coordinated with the operation of one or more HVAC components 6. The one or more HVAC controller(s) 18 may actuate active dampers 24 to an opened position, a closed position, and/or to a position between the opened position and closed position (e.g., a partially opened position) to modulate the flow of air from the one or more HVAC components 6 to an appropriate room and/or zone in the building 2 or other structure. The dampers 24 may be particularly useful in zoned HVAC systems, and may be used to control which zone(s) receive(s) conditioned air from the HVAC component(s) 6.

In some instances, register vents 26 may include one or more vent dampers 30 located at or adjacent a position which air or fluid exits the ductwork 10 and enters a conditioned space to control delivery of the conditioned air from the one or more supply air duct 10 into the building 2. The register vents 26 may include one or more manually operated register vents 26 with manually operated vent damper 30a (see FIG. 2) and/or one or more electronically controlled active register vents 26 with an electronically operated vent damper 30b (see FIG. 3). In some cases, the register vents 26 may be manually operated and electronically operated.

Illustratively, the register vents 26 may be utilized in any manner to facilitate comfort level conditioning in one or more spaces. In some instances, the register vents 26 may be utilized to form one or more zones in a comfort level conditioned space. For example, the register vents 26 may be utilized to create one or more zones in the conditioned space even though, to that point, the HVAC system was not a zoned system. Alternatively, or in addition, register vents 26 may be utilized to create one or more further zones or one or more sub-zones in an HVAC system that is already configured to be at least partially zoned.

As shown in FIG. 1, a building 2 may include a plurality of zones (e.g., zone 1, zone 2, and zone 3, or any other number of zones) with at least one sensor (e.g., a sensor at or of a building automation controller 18, a local sensor 34 (see below), or other sensor) in each zone. In some cases, each zone may include one or more electronically controllable register vent dampers 30b, such that the building automation controller 18 or other controller may be able to control the first zone differently from the second zone. Although the HVAC system in FIG. 1 for building 2 may be configured to include three zones, register vents 26 may be included in the HVAC system to provide additional or alternate control over the flow of fluid through the ductwork of the HVAC system and conditioned spaces of the building 2. For example, when a room or zone has a plurality of registers (e.g., locations where fluid from ductwork 10 enters a room or zone), register vents 26 may be utilized to create subzones within a zone, such as zones 2A, 2B, 3A, and 3B, as shown separated by dotted lines in FIG. 1, by allowing a user and/or a controller (e.g., one or more building automation controller 18, one or more controller at the register vents 26, and/or other controller) to close and/or open vent dampers 30 at the register vents 26 (e.g., manually and/or electronically open and/or close vent dampers 30).

As mentioned, each zone of a building (e.g., building 2) may include at least one sensor. In some instances, a sensor (e.g., a local sensor 34) may be associated with each register vent 26, but this is not required. In some cases, a sensor may be associated with two or more register vents 26 (such as two register vents located in the same zone). Alternatively, or in addition, a sensor may be associated with the building automation controller 18 and/or may be a remote sensor in communication with the building automation controller 18. The sensors may be configured to sense one or more environmental parameters and may be in communication with a local controller or other mechanism for communicating the sensed parameter to a device configured to adjust and/or monitor comfort level conditioning settings of the building automation system 4 (e.g., the HVAC system of building 2).

Figure 2:
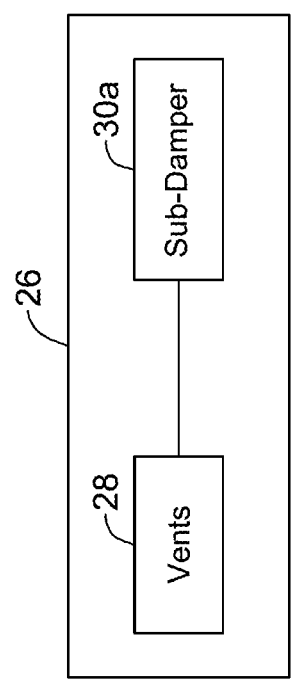
FIG. 2 is a schematic block diagram of an illustrative register vent.
Figure 3:
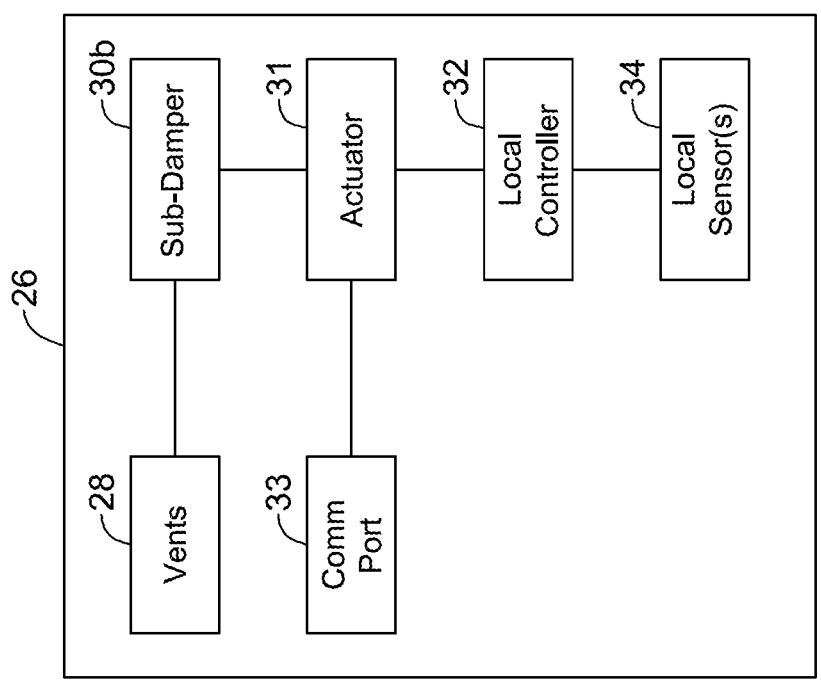
FIG. 3 is a schematic block diagram of another illustrative register vent.

Register vents 26 may include a vent 28 configured to receive fluid flow from a building automation sub-system 12 (e.g., fan 21, a furnace, an air conditioner, etc. of an HVAC system) and a manually operated vent damper 30a, as best shown in FIG. 2. The vent 28 may be in fluid communication with the ductwork 10 and the fluid traveling through the ductwork 10 may exit the ductwork through the vent 28. Where the ductwork 10 has a proximal end at an end adjacent a comfort level conditioned space and a distal end at an HVAC component 6 of a building automation sub-system 12, the manually operated vent damper 30a may be positioned proximal and/or distal of the vent 28. In some cases, the manually operated vent damper 30a may be mechanically coupled to the vent 28 to form a register vent 26 and/or the manually operated vent damper 30s.

In some instances, one or more register vents 26 of a plurality of register vents 26 of a conditioned space may be manually operated. Manually operated register vents 26 may be manually adjusted by a user by manually adjusting a mechanism to open and/or close a vent damper 30 with respect to an associated vent 28. Alternatively, or in addition, adding a manually operated vent damper 30a to a vent 28 may form a manually adjustable register vent 26.

In some cases, when a manually operable vent damper 30a is added to a vent 28, the vent damper 30 may be a magnetic sheet that is mechanically and/or electrically connected to a proximal side or distal side of the vent 28 and/or other vent damper 30 mechanism that may be mechanically connected to the vent 28. Manually operated register vents 26 refer to register vents 26 that include a manually operated vent damper 30a which may be manually adjusted by a user to control flow of fluid through an associated vent 28. In some instances, the manually operated register vents 26 may include a local controller and/or a local sensor for sensing environmental parameters, but this is not required.

In some instances, but not all, electronically controlled register vents 26 may include one or more of a vent 28, an electronically controlled vent damper 30b, an actuator 31, a local controller 32, a communications port or block 33 having a wired or wireless interface for communicating with the HVAC control system and/or other register vents 26, and/or a local sensor 34. An electronically controlled register vent 26 may be a register vent 26 that is capable of being selectively and/or automatically controlled by a controller (e.g. a local controller 32, a building automation controller 18, a remote system 36 and/or other controller).

When a register vent 26 includes a local sensor 34 or other sensor, it may be considered a sensing device. The local controller 32 of the register vent may be in communication with a building automation controller 18 other controller of the HVAC control system via communications port or block 33 of the register vent 26 and/or or other communications port or block (e.g., communications port or block 42, 44) having a wired or wireless interface and may be electronically controlled from the building automation controller 18 or other device or system in communication with the building automation controller 18. In instances when a plurality of electronically controlled register vents 26 are included in a building automation system 4, positions (e.g., an opened position, a closed position, or positions therebetween) of the electronically controlled vent dampers 30b with respect to the vents 28 of the electronically controlled register vents 26 may be controlled by the building automation controller 18 and/or any other controller including, but not limited to, the local controllers 32 at the register vent 26, and/or any device or system connected thereto.

Illustratively, the local sensor 34 of a register vent 26 associated with an electronically controlled register vent damper 30b may sense one or more local conditions in the building and the local controller 32 of the register vent 26 may communicate or issue one or more requests to the building automation controller 18 or other controller of the HVAC control system for conditioned air or other request of the HVAC system. In response to receiving the request, a controller of the HVAC control system may be configured to determine a setting (e.g., damper setting) for the electronically controlled register vent damper 30b and communicate the determined setting for the electronically controlled register vent damper 30b via the communications block of the HVAC control system to a user interface (e.g., user interface 46), to the local controller 32 of the register vent 26, and/or to one or more other device of the HVAC system or HVAC control system. The controller of the HVAC control system may determine which HVAC component(s) 6 should be active, if any, and provide one or more control signals to that HVAC component 6 to activate or keep active that HVAC component 6.

In some cases, the local controllers 32 may be in communication with one another to facilitate zone or sub-zone synchronization and/or optimization. In such instances, each local controller 32 may set a position of an associated vent damper 30 electronically in view of other set positions of other vent dampers 30 associated with other local controllers 32. In some instances, the local controllers 32 and/or other controllers in communication with the vent dampers 30 may consider the state of manually operated register vents 26, electronically operated register vents 26, vents 28 without vent dampers 30, and/or input from controllers (e.g., building automation controllers 18 or other controllers) of the building automation system 4 in addition to or other than the local controllers 32.

The local controllers 32 may be configured to have one-way or two-way communication with the building automation controller(s) 18 and/or a remote system 36 via communications port or block 33. In instances of one-way communication with the building automation controller(s) 18 and/or remote system 36, the local controllers 32 may communicate positions of the vent dampers 30, sensed parameters at or about the register vent 26, and/or other information to the building automation controller(s) 18 and/or the remote system 36. Alternatively, the local controllers 32 having one-way communication with the building automation controller(s) 18 and/or remote system 36 may receive positioning commands for the vent dampers 30 and/or other information from the building automation controller(s) 18 and/or the remote system 36. In instances of two-way communication with the building automation controller(s) 18 and/or the remote system 36, the local controllers 32 may communicate positions of the vent dampers 30, sensed parameters at or about the register vents 26, and/or other information to the building automation controller(s) 18 and/or the remote system 36, and the local controllers 32 may receive positioning commands for the vent dampers 30 and/or other comfort level conditioning information/commands from the building automation controller(s) 18 and/or the remote system 36. In one example of communication between the register vents 26 and the building automation controller 18, the register vents 26 may be configured to call for conditioning (e.g., heating and/or cooling) of an associated space (e.g., a zone or sub-zone), call for fan 21 operation, call for humidification, call for dehumidification, call for air purification, and/or call for operation of one or more other pieces of equipment.

Control of the register vents 26 may be centralized at the building automation controller 18, at any other controller in the building 2 (e.g., including, but not limited to, one of the local controllers 32), and/or at the remote system 36. When register vents 26 are centrally controlled, the building automation controller 18, other controller, and/or the remote system 36 may be able to control comfort level conditioning in a calculated manner (e.g., keep at least 10%-70%, 20%-60%, 30%-50%, or other range of vent dampers 30 in an open position) due to the knowledge of how much fluid is passing to one or more locations and at what time that fluid is reaching one or more locations within a comfort level controlled space. Illustratively, a building automation controller 18 or other controller that centrally controls the register vents 26 may take into consideration vent damper 30 position settings of manually controlled register vents 26, along with position settings of electronically controlled register vents 26. Understanding the positioning of all of the vent dampers 30, if any, associated with vents 28 in a comfort level conditioned space allows the building automation controller 18 or other central controller to apply comfort level conditioning settings for the building automation system 4 in view of an amount of fluid calculated to be reaching one or more locations of a space or zone. Keeping some minimum percentage of the vent dampers open may also help prevent excessive load on the fan 21 of the HVAC system servicing the building.

As discussed, and in some instances, a register vent 26 may include one or more local sensors 34. The local sensors 34 may be configured to sense one or more parameters related to setting a comfort level in the conditioned space and store and/or communicate the sensed parameters via the local controller 32. In one example, the local sensors 34 may be configured to sense one or more of a temperature, physical occupancy/presence, changes in temperature, humidity levels, changes in humidity level, air quality levels or conditions (e.g., particle count, light, volatile organic compound (VOC) concentration or levels, $CO_2$ concentration or levels, etc.), changes in air quality levels or conditions, sound through or around the register vents 26, vibrations, voice patterns, pressure, flow, and/or any other suitable sensed parameters. In some instances, the local sensors 34 and the local controllers 32 may be separate components or may be part of a single component.

In response to sensing one or more parameters with a sensing device of the building automation system 4, the local controllers 32, the building automation controllers 18, and/or the remote system 36 may take one or more actions to adjust a comfort level conditioning level within one or more particular spaces. In one example of using sensed parameters to adjust a comfort level within one or more particular spaces, a sensing device may provide a measurement of one or more sensed air quality conditions (e.g., particle count, light, volatile organic compound (VOC) concentration or levels, $CO_2$ concentration or levels, etc.) to a controller and the controller may determine settings for one or more air quality components (e.g., UV lamps, air purification systems, air cleaning systems, air exchangers, etc.) of the HVAC components 6 in the building automation system 4 based, at least in part, on the provided measurements of sensed air quality conditions.

As discussed in greater detail below, the HVAC control system may save or store values of sensed parameters in a remote system 36 (e.g., in a cloud server) and, in some cases, control one or more HVAC components 6 and/or register vent dampers 30 based, at least in part, on stored values of the sensed environmental parameters. Additionally, or alternatively, the HVAC control system may be configured to receive a request for data related to the sensed parameters and provide (e.g., to a user interface) a report for the data related to the sensed parameters based, at least in part, on the stored values of the sensed parameter.

The local controllers 32, the building automation controllers 18, and/or the remote system 36 may utilize outputs of a local sensor 34 as a primary sensed parameter for controlling comfort level conditioning of a space, as an averaged sensed parameter that is used in conjunction with other outputs of local sensors 34 and/or other sensors to control comfort level conditioning of a space, as a sensed zone parameter for controlling comfort level conditioning of a particular zoned or sub-zoned space, and/or as a sensed parameter for other comfort level conditioning. Such use of local sensors 34 at register vents 26 may facilitate dividing a comfort level conditioned space into zones (e.g., macro-zones) and/or sub-zones (e.g., micro-zones), identifying temperature gradients across a comfort level conditioned space and/or zones to optionally identify further zoning opportunities, improving an accuracy of a sensed parameter from a user comfort level perspective for a comfort level conditioned space by averaging a plurality of sensed parameters sensed by the local sensors 34, and/or may facilitate providing other functions and/or benefits.

In some instances, the local sensors 34 or other sensors may sense when someone is present in a comfort level conditioned space and apply settings for the comfort level conditioned space associated with a "space occupied" profile or other profile. In other similar or different instances, the local sensors 34 may be configured to sense when a particular individual is present in a comfort level conditioned space and apply settings for the comfort level conditioned space associated with that particular individual's profile saved in a memory of one or more of the local controller 32, the building automation controller 18, and the remote system 36. The local sensors 34 may identify particular individuals in any manner, including but not limited to, sensing an individual's biometrics, sensing an individual's voice, sensing vibrations caused by an individual advancing through a space, sensing an identification tag carried by the individual (e.g. RFID tag, cell phone, etc.), and/or other identifying techniques. Additionally, or alternatively, the local sensors 34 or other sensors may sense other parameters and/or apply one or more comfort level conditioning profiles as determined by a preset or predefined program of the HVAC system.

In some instances, a controller of or in communication with the HVAC system may be capable of identifying one or more local devices 56 (see FIG. 5) in the building 2 via a communications block or port (e.g., wireless communications port or block 54 or other communications block or port). In one example, a building automation controller 18 may be configured to identify and/or detect one or more devices (e.g., local devices 56) local to a space of which the building automation controller 18 at least partially controls the comfort level conditioning. In some cases, the building automation controller 18 or other controller may be able to control one or more of the local devices 56. A local device 56 may be, but is not limited to, controllable or uncontrollable non-HVAC components such as an appliance, an oven, a stove, a window, a window treatment, a refrigerator, a cooler, a freezer, an iron, a grill, a room fan, an air freshener, a portable dehumidifier, a portable humidifier, and/or other indoor devices or goods that may have an effect on comfort level conditioning of a space. In some instances, a local device 56 may be an auxiliary environmental parameter control device including, but not limited to, a window air conditioning unit, a wall air conditioning unit, a portable electric heater, an electric fireplace, a portable electric fan, a ceiling fan, an electric floor heater, and so on.

Figure 5:
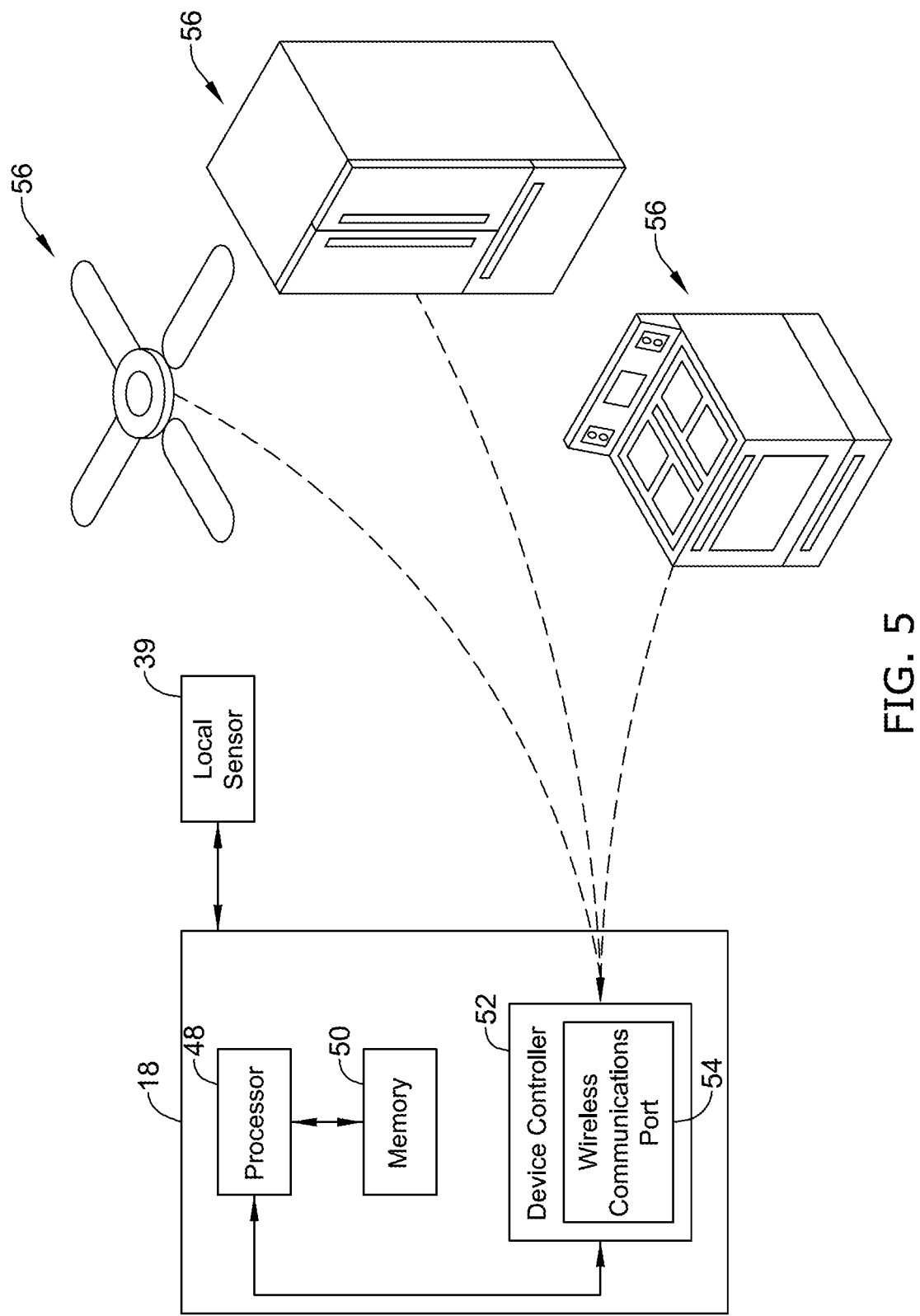
FIG. 5 is a schematic diagram of an illustrative local device sensing system.

A building automation controller 18 (e.g., a thermostat or other controller), as depicted in FIG. 5, may include a processor 48 and memory 50. In some cases, a device controller 52 (e.g., including memory and a processor—not shown) including or in communication with a wireless communications port or block 54 may be included in the building automation controller 18 as a sub-controller of the building automation controller 18 or other feature thereof. Additionally, or alternatively, the device controller 52 may be located exterior the building automation controller 18 and may be in communication with the building automation controller 18 via a wired or wireless connection. The device controller 52 of or in communication with the building automation controller 18 may be configured to automatically or upon request sense via a wired connection or through the wireless communication port or block 54 (e.g., over one or more wireless protocols, including, but not limited to, cellular communication, IEEE 802.11, ZigBee, REDLINK™, Bluetooth, WiFi, IrDA, dedicated short range communication (DSRC), EnOcean, and/or any other suitable common or proprietary wireless protocol, as desired) one or more local devices 56 and/or actions taken thereby.

The device controller 52 may be configured to automatically or upon request sense a local device 56, sense an action taken thereby through detecting one or more changes in environmental parameters, and/or send a control signal to the local device 56. In such instances, the device controller 52 may be in communication with the local sensors 34 or other sensors of the HVAC system to receive environment parameter data. Through analyses of changes in the received environmental parameter data, the device controller 52 may identify the presence of a local device 56 and/or an action taken thereby. In some cases, the device controller 52 may detect a presence of a local device 56 via a wired or wireless communication and the device controller 52 may identify an action taken by a local device 56 via analysis of environmental parameter data. In one example, the device controller 52 may analyze data received from a local sensor 34 adjacent a stove and may determine when the data from the local sensor 34 is indicating a rise in temperature. From the identification of the rise in temperature, the device controller 52 may identify the stove has taken a heating action and indicate that action taken to the processor 48 of the building automation controller 18. In response, the building automation controller 18 may set a vent damper 30 of a register vent 26 adjacent the space in which the stove is located to an opened position to cool the space and/or take other actions to compensate for the identified action taken by the stove.

When the device controller 52 detects that a local device 56 has taken an action or has been caused to make an action, the device controller 52 may provide a signal to the processor 48 of the building automation controller 18. In response to receiving a signal from the device controller 52 indicating a local device is taking or has made an action, the building automation controller 18 may, via a user interface 46 (e.g., the user interface 46 may be, but is not limited to one or more of, a mobile phone, a personal digital assistant, a laptop computer, a desktop computer, a thermostat screen, a voice control system, and other interfaces), suggest an adjustment to, or may automatically adjust, an environmental parameter set point of one or more HVAC components 6 conditioning a particular space or particular zone. In one instance, the building automation controller 18 may be configured to adjust a position setting of a vent damper 30 of one or more register vents 26 adjacent the space in which the local device 56 is located in response to the device controller 52 detecting one or more of a local device 56 and an action taken or made by the detected local device 56.

In some cases, the device controller 52 may be configured to detect one or more auxiliary environmental parameter control devices (e.g., a portable heater, a window air conditioner, or space conditioning device not directly controlled by the building automation controller 18). In response to detection of one or more of the auxiliary environmental parameter control devices and communication of the detection to the processor 48 of the building automation controller 18, the building automation controller 18 may be configured to adjust a position setting of a vent damper 30 of one or more register vents 26 and/or adjust one or more other settings. In some instances, the device controller 52 may receive a status signal from the auxiliary environmental parameter control device indicating a setting thereof (e.g., on/off, hi/low, level 1 or 2 or 3, etc.), and the building automation controller 18 may adjust a position of vent damper 30 of one or more register vents 26 and/or other settings to account for the setting of the auxiliary environmental parameter control device and maintain proper comfort level conditioning in a space. In some cases, the device controller 52 may change a setting of the auxiliary environmental parameter control device, such as turn on or off the auxiliary environmental parameter control device.

Figure 4:
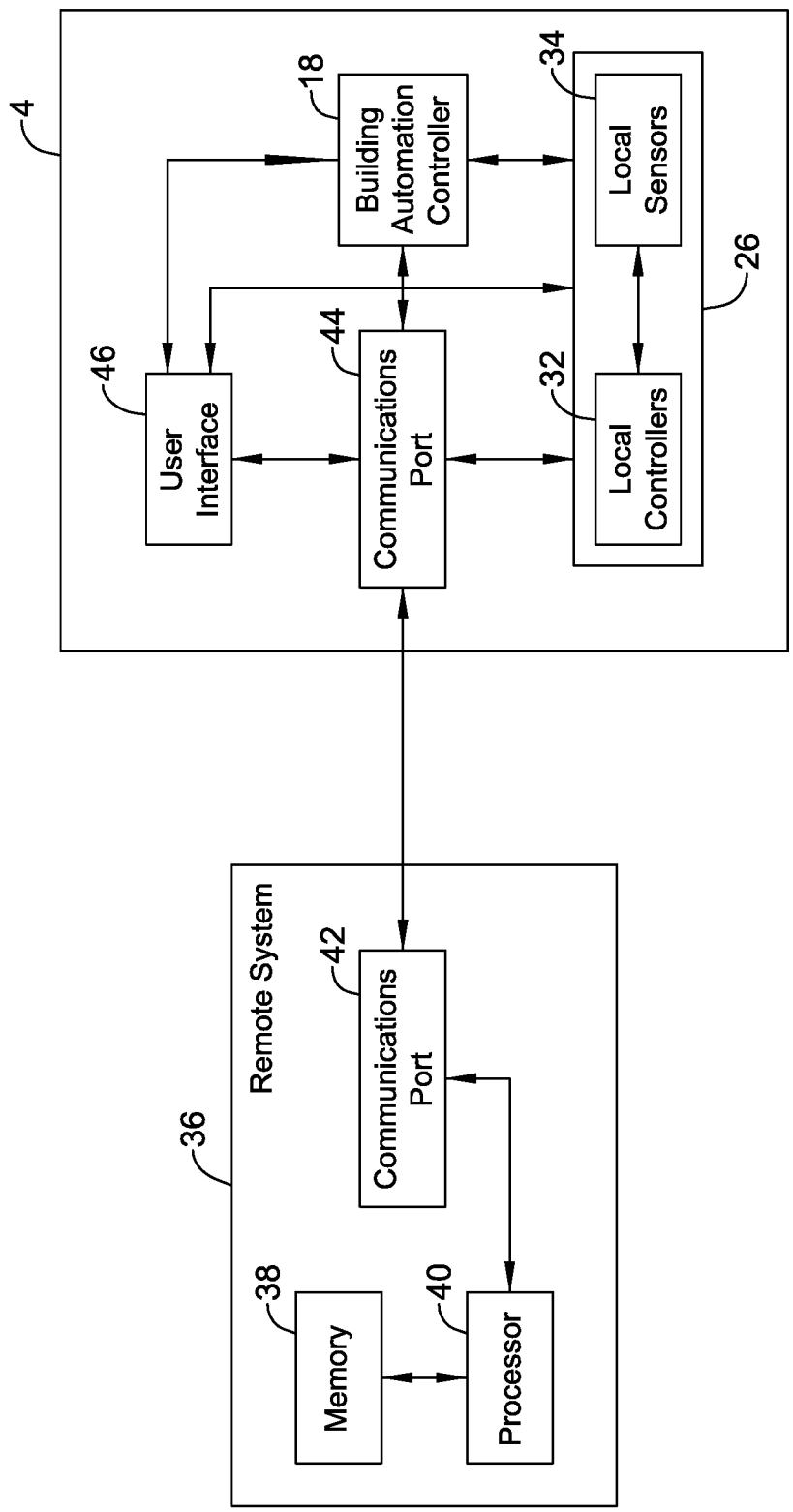
FIG. 4 is a schematic block diagram of an illustrative connection between a remote system and a building automation system.

In some cases, the local sensors 34 and/or other sensors of the building automation system 4 that may be configured to sense one or more parameters of a comfort level conditioned space and may communicate the sensed parameters to the remote system 36 via one or more operably coupled local controllers 32 and/or the building automation controller 18 through the use of an operably coupled local communications port or block 44, as best shown in FIG. 4. Illustratively, the remote system 36 and/or the building automation controller 18 may include a memory 38 and a processor 40, where the memory 38 or other memory may store data obtained from the sensors of the building automation system 4, other data from users, and/or instructions executable by the processor 40 to analyze and/or configure the data obtained from the sensors of the building automation system 4 and/or configure other data obtained from a user. The memory 38 and/or other memory discussed herein may be non-transitory computer readable media. In one instance, the processor 40 may be configured to execute instructions stored in the memory 38 or other memory to perform thermodynamic analyses, model development, HVAC configuration development, and/or other analyses using the data and/or information received from the building automation system 4 and additionally or alternatively configure the data and/or results of the analyses for communication to a user interface 46 of or in communication with the building automation system 4.

The user interface 46 may be configured to communicate with controllers (e.g., the remote system 36 (e.g., cloud server), the local controller 32, the building automation controller 18, and/or other controllers) of or in communication with the HVAC system to obtain and/or receive analyses from one or more of the controllers based on data received from the local sensors 34 and/or other data. The obtained and/or received analyses may be of data specific to one or more particular zones or sub-zones and/or to any portion of or an entirety of the space that is conditioned with the building automation system 4. Illustratively, the controllers of the HVAC system of a building 2 may monitor the thermodynamics of different areas of the building 2. Such monitoring may include tracking heat gain and/or loss of each zone independently of other zones, which may allow the controllers to send to the user interface 46 suggested position settings for vent dampers 30 that may impact a rate of heating or cooling of a particular conditioned space of a building 2. The positioning of vent dampers 30 according to suggested position settings may facilitate establishing more even temperatures throughout a building because different spaces/zones/sub-zones throughout a building 2 may reach a set temperature at a more similar time, rather than at different times, which is often the case when all of the vent dampers 30 are set to the fully open position.

In addition, or as an alternative, to obtained and/or received analyses of data from local sensors 34, the obtained and/or received analyses at a user interface 46 may take into account data for area conditioning parameters of a plurality of HVAC systems, sizes of the vents 28 of the register vents 26, and/or sizes of the vent dampers 30 of the register vents 26. In some cases, the plurality of HVAC systems may be located in a single building or in one or more buildings about or around a subject building 2 (e.g., buildings in a neighborhood, on a same city block, etc.). In one example, the remote system 36 may be configured to monitor homes (e.g., buildings 2) in a community and track the impact of suggested changes to positions of vent dampers 30 and/or suggested changes to other HVAC components 6 on the operation of HVAC systems or thermodynamics in those homes. The remote system 36 may then compare the suggested changes of similar type, sized, geographically positioned, and/or geographically oriented homes to one another to determine successful changes. The successful changes may then be tracked over time and suggested to other users of the remote system 36 in response to environmental season changes, solar strength changes, humidity level changes, and/or other changes.

In some cases, analyses obtained and/or received by the user interface 46, may include recommendations for configuring one or more HVAC components 6 of an HVAC system. Illustratively, the recommendations may include one or more zoning recommendations, register vent 26 setting recommendations, temperature set point (or temperature program schedule) recommendations, etc., from the remote system 36, the local controllers 32, the building automation controllers 18, and/or other controllers.

The one or more zoning recommendations may, as discussed in further detail below, be developed based at least partially on sensed conditioning parameters of an area to be comfort level conditioned and/or data for sensed conditioning parameters of areas to be comfort level conditioned by one or more other HVAC systems (e.g., HVAC systems in buildings other than a subject building 2) received through a communications port or block (e.g., communications port or block 42 and/or communications port or block 44). Zoning recommendations may include general instructions or suggestions on how to zone a building 2, how to manually set zones, how to modify an existing zone to create sub-zones, when to modify an existing zone, how to set vent dampers 30 of register vents, and/or other instructions.

In one example of a building automation system 4 obtaining instructions, the remote system 36, local controller 32, the building automation controller 18, and/or other controller may provide an instruction to one or more register vents 26 (e.g., an electronically controlled register vent) to adjust a vent damper 30 for the purpose of improving the efficiency of establishing a desired comfort level conditioning setting or for other building conditioning-related purposes in response to obtaining or receiving the analyses from a controller of the HVAC system based, at least in part, on sensed data from local sensors 34 or other sensors. In some cases, the instruction to one or more register vents 26 may be provided to improve uniformity of temperature between spaced sensor locations, between spaced register vent locations, register dampers locations and/or generally within a space, to allow at least a minimum air flow from the HVAC system to help protect the HVAC system from damage, to maintain at least a minimum number of register vent dampers 30 in an open state, and/or for one or more other purposes. An indication of the provided instruction may be sent to the user interface 46 to alert a user of the instruction. In some cases, the controller of the HVAC system may be optionally and/or selectively set to automatically provide an instruction to one or more register vents 26 to adjust its vent damper 30 in response to a received recommendation and/or the controller may be optionally or selectively set to require a confirmation from a user at the user interface 46 before sending an instruction to one or more register vents 26 to adjust its vent damper 30. In some cases, an instruction may be sent to one or more register vents 26 for execution, and nothing may be sent to the user interface.

The user interface 46 or other user interface may be configured to indicate and/or display one or more suggestions or recommendations from a controller of the HVAC control system for manually setting positions of vent dampers 30 (e.g., a manually adjustable register vent dampers 30*a*) of one or more register vents 26 based, at least in part, on sensed data received from local sensors 34 or other sensors. The one or more suggestions may be obtained from one or more controllers of or in communication with the HVAC system of a building 2 (e.g., the controllers may include one or more of the remote system 36, the local controller 32, the building automation controller 18, and/or other controller). The controllers of the HVAC system of the building 2 may base the suggestions for manually setting positions of the vent dampers 30*a* at least partially on either or both of area conditioning parameters sensed by a sensor of the HVAC system and data related to conditioning parameters of one or more HVAC systems in a similar geographic region as a subject HVAC system.

As referred to above, the HVAC system of building 2 may include a plurality of register vents 26, where all of the plurality of register vents 26 are electronically controlled, all of the plurality of register vents 26 are manually controlled, and/or a portion of the plurality of register vents 26 are electronically controlled and a portion of the register vents 26 are manually controlled. In instances where the plurality of register vents 26 include one or more manually controlled register vents 26, a controller of or in communication with the HVAC system may suggest to the user a setting for a manually operated register vent 26 (e.g., a position setting for a manually operated vent damper 30*a*) to improve uniformity of temperature between spaced sensor locations, between spaced register vent locations, register dampers locations and/or generally within a space, to allow at least a minimum air flow from the HVAC system to help protect the HVAC system from damage, to maintain at least a minimum number of register vent dampers 30 in an open state, and/or for one or more other purposes. In instances where the plurality of register vents 26 include one or more electronically controlled register vents 26, a controller of or in communication with the HVAC system may suggest a setting for an electronically operated register vent 26 (e.g., a position setting for an electronically controllable vent damper 30*b*). In instances where the plurality of register vents 26 include both manually controlled register vents and electronically controlled register vents 26, a controller of or in communication with the HVAC system may suggest a setting for a manually operable register vent 26 and may request authorization to automatically set the position of the electronically operable register vents 26.

In response to receiving a suggestion at the user interface 46 for position settings of vent dampers 30 of the register vents 26, a user may, in some cases, be presented with an option to accept the suggestion, reject the suggestion, or modify the suggestion via the user interface 46. When the register vents 26 include both electronically controlled and manually controlled vent dampers 30*a*, the user interface 46 may provide or display options to accept the suggestion, reject the suggestion, or modify the suggestion with respect to the electronically operable vent dampers 30*b*, the manually operable vent dampers 30*a*, or both.

When the register vents 26 have manually operable vent dampers 30*a*, a user may accept, reject, or modify the position setting suggestion for the manually operable vent dampers 30*a* and then either manually adjust the manually operable vent dampers 30*a* according to the suggestion or the modified suggestion, or do nothing in the event the suggestion was rejected. After the user has made a selection or confirmation at the user interface 46 with respect to acceptance, rejection, or modification of the suggested position setting for the vent dampers 30, one or more controllers of the HVAC system may monitor heat gain and/or loss, or other parameter, to determine whether the user positioned the vent dampers 30 consistent with accepting, rejecting, or modifying the suggested position setting of the vent dampers 30. If no change in heat gain and/or loss, or other parameter, is realized by the controller of or in communication with the HVAC system, the controller may determine no changes were made (which may be consistent with rejecting a suggested vent damper 30 position setting) or that the changes made had no impact. Identification by the controller of or in communication with the HVAC system of either situation may prompt the controller to recommend the changes again or recommend new changes to the system to try and impact the comfort level conditioning in a space in a desirable manner. Alternatively, the controller may recognize that a user is not interested in obtaining instructions, and refrain from providing further suggestions of position settings for vent dampers 30 for a selected or default period of time.

When the register vents 26 have electronically operable vent dampers 30b, a user may accept, reject, or modify the position setting suggestion for the electronically operable vent dampers 30b and then, in response, the controller(s) of or in communication with the HVAC system may automatically effect the position settings of the vent dampers 30. Alternatively, the controllers of or in communication with the HVAC system may automatically effect any suggestion and provide a confirmation to the user interface 46 of such changes to the position settings of the vent dampers 30. After a suggestion has been implemented/accepted, rejected, or modified, one or more controllers of the HVAC system may monitor heat gain and/or loss, or other parameter, as discussed above, to determine the effect of the modification of the vent damper position setting on sensed comfort level parameters in the conditioned space. The controller(s) of or in communication with the HVAC system may learn from the monitoring which vent damper 30 position settings may be effective and which are not as effective for improving the operation of the HVAC system over time.

When either or both electronically operable vent dampers 30b and manually operable vent dampers 30a are included in a building automation system 4, the controllers of or in communication with the HVAC system may take into consideration whether a user accepted, rejected, or modified one or more of the suggested position settings for either or both of the manually operable vent dampers 30a and the electronically operable vent dampers 30b. For example, if the suggested position settings for the manually operable vent dampers 30a are rejected and the position settings for the electronically operable vent dampers 30b are accepted, the controller(s) of or in communication with the HVAC system may modify the suggested position settings taking into account the lack of desire on the part of a user to change the position settings of the manually operable vent dampers 30a.

The HVAC system may store an indicator of vent damper settings or positions of one or more of the vent dampers 30 in memory 38 or other memory. Additionally or alternatively, the HVAC system may store data sensed by the local sensors 34 or other sensors, sensor locations of the local sensors 34 or other sensors within the building 2, an indicator of register vent 26 locations within the building 2, an indicator of register vent damper 30 locations within the building 2, thermodynamic properties of the building 2, historical sensed data, and/or other building automation system 4 information. The building automation controller 18 or other controller may determine recommended settings for devices of or related to the HVAC system (e.g., one or more manually adjustable register vent dampers 30a, etc.) and/or may control device of or related to the HVAC system (e.g., one or more electronically controllable register vent dampers 30b, etc.) based, at least in part, on the received sensed data, the stored indicators of the sensor locations, the stored indicators of register vent 26 locations within the building 2, the stored indicators of register vent damper 30 locations within the building 2, analyses of thermodynamic properties of the building 2, historical sensed data, other building automation system 4 information, and/or similar or dissimilar HVAC related data from each of a plurality of HVAC systems.

The building automation controller 18 or other controller (e.g., a controller of the remote system 36) may use stored or other building information (e.g., as discussed above) to make and/or implement recommendations including setting changes to the building automation system 4 and display those recommendations via a user interface. In one example, operation of an HVAC control system may include collecting environmental sensor data via two or more sensing devices located at two or more identified locations within a building. Then, analyzing the collected environmental sensor data in conjunction with the two or more identified locations of the sensors providing the data to determine recommended HVAC component 6 setting changes, if any, based at least partially on the sensed and/or stored data (e.g., collected data) and displaying the recommended setting changes to a user via a user interface that may be associated with the HVAC control system. If no changes are recommended, an indication that no changes were identified may be displayed on the user interface.

In one case, recommended setting changes and/or setting changes based on the sensed and/or stored data may include a manual adjustment to one or more manually adjustable register dampers, an adjustment to one or more electronically controllable register dampers, a suggestion to incorporate an electronically controllable register damper in the building at a particular location, an adjustment to a fan setting of the HVAC system (e.g., changing a mode of the fan between an on mode (e.g., the fan is always running when in this mode), an off mode (e.g., the fan is never runs while in this mode), an auto mode (e.g., when in this mode, the fan runs while the furnace, air conditioner, or other forced air HVAC component is running), a circulate mode (e.g., when in this mode, the fan runs according to a set schedule or a set percentage of the time in addition to running when the furnace, air conditioner, or other forced air HVAC component is running), and/or other modes) and/or other HVAC related recommendations. Such recommended setting changes and/or setting changes may facilitate optimizing a flow of air through a building to adjust a comfort level in the building and/or a specified zone, sub-zone, or area of the building.

In one example of using stored building automation system 4 information, the building automation controller 18 or other controller may be configured to make macro-zone and/or micro-zone adjustments and/or recommendations. When a building is zoned by floors, for example, the building automation controller 18 may be configured to maintain a first comfort level in a first macro zone of a first floor and a second comfort level in a second macro zone of a second floor. By using stored building automation system 4 information (e.g., settings or positions of register vent dampers 30 or other building automation system 4 information) or other information, the building automation controller 18 or other controller may adjust or provide a recommendation to adjust one or more settings (e.g., to adjust a register vent damper 30 setting, change a fan setting of the HVAC system to one of an on mode, an off mode, an auto mode, and a circulation mode, change a position of a window treatment) for a sub-zone or micro-zone within one or more of the first macro-zone and the second macro-zone that may be considered to be more effective than another option based on the stored building automation system 4 information. In some instances, a micro-zone may be established to compensate for a hot spot or cool spot within the macro-zone and/or to allow a user to adjust a comfort level of only a portion of a larger zone.

As discussed, the building automation controller 18 or other controllers may adjust or provide instructions or recommendations for adjusting individual register vent dampers in one or more zones of a building 2. In one example, the building automation controller 18 may be configured to adjust and/or determine a first recommended setting for one or more register vent dampers 30 (e.g., manually adjustable and/or electronically controllable register vent dampers) that service a first zone of the building 2 and a second recommended setting for one or more register vent dampers 30 (e.g., manually adjustable and/or electronically controllable register vent dampers) that service a second zone of the building 2 based, at least in part, on stored building automation system 4 information and/or other information.

The controllers of or in communication with the HVAC system may continually monitor the impact of suggested and/or implemented adjustments on a performance of the HVAC system (e.g., vent dampers 30 settings, fan 21 settings, etc.). In response to the monitoring of the HVAC system, the controllers of or in communication with the HVAC system may (optionally) automatically adjust settings of the HVAC components 6 and/or recommend or suggest changes to settings of the HVAC components 6. In some cases, the controllers of the HVAC system may learn from the monitoring of the HVAC system settings and the effect of those settings on a conditioned space, such that the controllers of or in communication with the HVAC system may provide improved suggestions over time.

In one example of controllers of or in communication with an HVAC system that monitor adjustments to the settings of HVAC components and the associated effect on a comfort level of a conditioned space, if any, the controllers may suggest through the user interface 46 that a user closes all vent dampers 30 in a basement, the user set all of the vent dampers 30 on a middle level to a 50% open position, and leave all vent dampers 30 on the upper level fully open. The user then may indicate through the user interface 46 that such suggested changes were made. In the example, the controllers of or in communication with the HVAC system may notice the user changed a sleeping temperature when the HVAC system was in a cooling mode to a higher setting. The controllers of or in communication with the HVAC system may then conclude that the suggested changes and/or changes made were successful and potentially resulted in energy savings due to the allowed higher temperature when the system was in a cooling mode. The controllers (e.g., via the remote system 36) may then push the suggested HVAC component 6 settings (e.g., settings of vent dampers 30) to other buildings (e.g., homes) in a community around the monitored building. Additionally, or alternatively, the controllers may store the suggested HVAC component 6 settings for similar situations (e.g., situations taking into account past, current, and expected future thermodynamics of a building 2, conditions outdoors, etc.) in the future. In some cases, these settings may be automatically applied when similar environmental situations are identified in the future.

In some instances, the remote system 36 may include a remote communications port or block 42, where the remote communications port or block 42 may be in communication with the processor 40 and the memory 38 of the remote system 36, along with a local communications port or block 44 of one or more building automation systems 4. The local communications port or block 44 may be in communication with the local controllers 32 and/or local sensors 34 of the register vents 26, the building automation controllers 18, and/or a user interface 46 of the building automation system 4. The local communications port or block 44 may be a part of or may be a separate device from one or more of the local controllers 32 of the register vents 30, the building automation controllers 18, the user interface 46, and/or other device or feature of the building automation system 4.

The remote system 36 may be a cloud based (e.g., internet connected) system that is configured to connect and/or monitor one or more HVAC systems of one or more related or unrelated buildings. In one instance, the remote system 36 may be configured to monitor the number of register dampers in a building 2 and ensures a requisite amount of air is delivered to one or more conditioned spaces of the building 2. In an example and similar to as discussed above regarding centralized control, the remote system 36 may attempt to ensure 10%-70%, 20%-60%, 30%-50%, or other appropriate percentage range of the number of register vents 26 in the building are open and fluid is flowing form an HVAC component 6 through the vents 28. Such monitoring is helpful in preventing and/or mitigating static pressure build up in ductwork of an HVAC system of the building 2 and protecting HVAC components 6 of the HVAC system.

In some instances, the remote system 36 may monitor previous, current, and/or anticipated outdoor conditions. Such monitoring may include, but is not limited to, monitoring temperature, humidity, solar strength, solar position, and/or other outdoor conditions. In response, at least in part, to analyses performed on the outdoor conditions, the remote system 36 may suggest adjusting a position of one or more vent dampers 30 to ensure proper conditioning of all areas of a conditioned space (e.g., a house). In one example, the remote system 36 may determine an expected sun pattern will heat up a south facing side of a building faster than a north facing side at a particular time and thus, the remote system 36 may suggest maintaining vent dampers 30 on the south side of the building 2 in an open position longer during the summer months to cool the conditioned space adjacent the south side of the building 2 and compensate for the predicted solar load. Alternatively, or in addition, to monitoring and/or configuring a position of the vent dampers 30, the remote system 36 may be configured to adjust one or more HVAC related accessories and/or other accessories in the building that may be able to impact comfort level conditioning in a building or space in an efficient manner. For example, the remote system 36 may suggest that a user opens or closes shades and/or opens or closes windows in response to monitoring an outdoor condition. In instances where a building automation controller 18 is connected to or in communication with building accessories (e.g., window coverings, windows, etc.), the remote system 36 may communicate directly to the connected building accessories to position one or more of those building accessories at a particular setting to more efficiently operate the HVAC system in an economical manner while maintaining comfort for users in the building 2. In some cases, the remote system 36 may suggest turning on an auxiliary environmental parameter control device (e.g. a window air conditioning unit, a wall air conditioning unit, a portable electric heater, an electric fireplace, a portable electric fan, a ceiling fan, an electric floor heater) to maintain comfort if appropriate. When one or more auxiliary environmental parameter control devices can be controlled by the remote system 36, the remote system 36 may automatically active/deactivate such auxiliary environmental parameter control devices as appropriate.

The remote system 36 may be configured to monitor past, current, and/or future utility rates and/or usage of gas, electric, water, etc. for and/or at the building 2. From the information obtained by monitoring utility rates and/or utility usage, the remote system 36 may communicate with the building automation controller(s) 18 to facilitate operating the HVAC system at an energy efficient level while maintaining comfort for users occupying the conditioned space. In one example, the remote system 36 may suggest the HVAC system utilize a lower cost HVAC component 6 (e.g., electric heaters) when the cost of using an associated type of energy (electricity) is less than the cost of using a different type of energy (e.g., gas) for a different HVAC component (e.g., a gas furnace) that performs a similar conditioning function. The remote system 36 may, in some cases, automatically instruct the HVAC system to utilize a lower cost HVAC component 6 (e.g., electric heaters) when the cost of using an associated type of energy (electricity) is less than the cost of using a different type of energy (e.g., gas) for a different HVAC component (e.g., a gas furnace) that performs a similar conditioning function.

In some cases, the remote system 36, the building automation controller 18, and/or other systems or controllers may monitor an occupancy of the building 2. In one example of monitoring occupancy of the building 2, the remote system 36, the building automation controller 18, and/or other systems or controllers may utilize geofencing, an occupancy sensor, and/or one or more other mechanisms providing occupancy related information and/or data to monitor and/or determine occupancy of the building 2. Through monitoring occupancy of a building 2, such as through geofencing, the remote system 36 may suggest position settings for vent dampers 30 and/or other settings for HVAC components 6 to assist in limiting or minimizing cycling and/or run time of HVAC components 6. Cycling and/or run times may be limited or minimized by running heating and/or cooling operations of the HVAC system at a lower frequency when the building 2 or a space thereof is determined to be unoccupied. Such limiting or minimizing of cycling and/or run time of the HVAC components 6 may reduce the energy usage of the HVAC system, extend the life of one or more of the HVAC components 6, and/or allow zones of a zoned system to sync and operate similar to a non-zoned system. Geofencing may be particularly useful when HVAC components 6 that may be slower to condition a space to a set point (e.g., hydronics) are utilized for conditioning a space because the crossing of a geofence can be utilized to turn the HVAC component 6 on in sufficient time, or use additional HVAC components 6 to assist in reaching the desired set point before the space is expected to be occupied.

Geofencing is a term used to refer to sensing locations of an individual or device (e.g. via a location aware device) with respect to a geographically defined fence that is established a particular distance from the building. When an individual or device leaves the building and advances to a position outside of the particular distance from the building, the location aware device may detect that the user has crossed the geofence and is leaving for some time. Once a user exits the geofence, the building automation controller 18 may be configured to modify the operation of one or more HVAC components 6 (e.g., to a no occupancy profile). When an individual or device is returning to the building and advances to a position inside of the particular distance from the building, the location aware device may detect that the user has crossed the geofence and is returning home. Once a user enters the geofence, the building automation controller 18 may be configured to modify the operation of one or more HVAC components 6 (e.g., to an occupied profile).

In some instances, a system of the building automation system 4 (e.g., remote system 36 or other system) may be configured to create a model of one or more spaces of a building 2 to be controlled with a developed HVAC system configuration created by the remote system 36. Illustratively, a processing module (e.g., the processor 40 of the remote system 36 or processor of a mobile phone, a tablet, a laptop computer, or other computing device) may be configured to execute one or more sets of instructions stored in memory (e.g., the memory 38) to develop an HVAC system configuration for the modeled space(s) of the building 2. Through a user interacting with the remote system 36 via a web portal or other user interface accessible via the user interface 46 (e.g., a user interface of a thermostat, a mobile application, a web site, a PC application, thermostat screen, etc. accessible on a mobile phone, a tablet, laptop computer, or other computing device) of the building automation system 4, an HVAC system configuration for controlling one or more environmental parameters of the one or more spaces of a building 2 may be developed by the processor 40 of the remote system 36. As an alternative to or in addition to using the remote system 36 to create a model of one or more spaces of a building 2 to be controlled with a developed HVAC system configuration, a building automation controller 18 or other electronic device with appropriate software or applications executable thereon may be configured to develop a model for one or more spaces of a building 2 and one or more HVAC system configurations for those spaces. The user interface 46 may be configured to display the developed model for the one or more spaces of the building 2 and/or the one or more HVAC system configurations.

A model of a space and an HVAC system configuration for that space may be developed by the remote system 36 or other system based on building information that at least partially defines an exterior and/or inner structure of at least part of the building including a space to be conditioned and/or controlled, at least in part, by the developed HVAC system configuration, which may be received via a user interface (e.g., the user interface 46) and a communications port or block (e.g., the communications port or block 42). For example, a user may upload or otherwise provide building information (e.g., selection of one of two or more building type options presented via the user interface, photographs of the interior and/or exterior of the building, a 2-dimensional floorplan or layout of at least part of the building, a 3-dimensional model or layout of at least part of the building, building dimensions, current HVAC system confirmation information for the HVAC system of the building (e.g., including, but not limited to, current locations of one or more register vents within the building), non-HVAC device configurations, etc.) to the remote system 36 through the user interface 46 and/or the remote system 36 may obtain the building information from the user's accounts (e.g., social media or photo sharing/storing databases, etc.) and/or publicly available sources. Additionally, or alternatively, controllers of an existing HVAC control system of the building may automatically detect existing sensors, vent dampers, and/or HVAC or non-HVAC devices of the building and use this information in developing a model of the space and HVAC system. Once the building information is received, a processing module (e.g., processor 40) operatively coupled to the user interface 46 may be configured to create a model of the one or more spaces to be conditioned or controlled by a suggested or developed HVAC system configuration, where the model is developed, at least in part, from the received building information.

Additionally, or alternatively, to developing the model based on building information received via the user interface 46, the processor may be configured to develop the model of the one or more spaces to be controlled and/or conditioned by the developed HVAC system based, at least in part, on information obtained by the processor 40 of the remote system 36. In some cases, a user may enter instructions at the user interface 46 for the remote system 36 to obtain publicly accessible information and/or information stored in the remote system 36 that relates to the building 2 in which the space to be controlled and/or conditioned is located (e.g., building type information, building dimension, or other information). In some instances, the processor 40 of the remote system 36 may obtain the information from a publicly available database, such as an online mapping database, online real estate databases, online tax records, online municipality records, and the like.

In some cases, the remote system 36 may be configured to communicate with the building automation controller 18, if the building 2 includes one, to determine what, if any, HVAC component 6 or other local devices 56 are located in the building 2. If the remote system 36 detects the building includes one or more HVAC components 6, the processor 40 of the remote system 36 may develop an HVAC configuration for the one or more spaces of the building 2 that may incorporate one or more of the detected HVAC components 6 and/or takes into account one or more of the detected local devices 56. One example of taking a detection of a local device 56 into account, is to develop an HVAC system configuration that provides a register vent 26 in a room with a stove, but does not place the register vent behind the stove, where the local device 56 is the stove.

The HVAC system configuration developed by the remote system 36 may be displayed on the user interface and may include a two-dimensional and/or three-dimensional model of the building 2 and/or the spaces of the building 2 to be conditioned and/or controlled, an HVAC system layout, and suggested HVAC system products for implementing a suggested HVAC system configuration. Additionally, or alternatively, the developed HVAC system configuration may include one or more devices having environmental parameter sensors (e.g., local sensors 34 or other sensors) and one or more register vents 26 (e.g., register vents with vent dampers), among other HVAC components 6, where the developed HVAC system configuration may include suggestions to replace specific HVAC system elements (e.g., a suggestion to replace a manually operated vent damper with an electronically controllable register vent). The HVAC system layout developed by the processor 40 may include suggested zone configurations and/or positions of register vents 26 for the one or more spaces to be controlled and/or conditioned. The user interface may be configured to accept selection of a suggested HVAC system configuration and or purchases of suggested HVAC system products of implementing a suggested HVAC system configuration.

The HVAC system configuration for the building 2 developed by the remote system 36 may include one or more HVAC system configuration options. In some cases, the remote system 36 may provide an HVAC system configuration utilizing HVAC components 6 existing in a modeled space of the building 2 and/or a basic HVAC system configuration. In addition, or as an alternative, the remote system 36 may provide one or more advanced level HVAC system configurations that may increase in cost and/or complexity to implement. In some examples, the advanced level HVAC system configurations may include cost estimates and/or time estimates to implement the proposed advanced level HVAC system configuration in the modeled space, along with estimated benefits of the advanced level HVAC system configurations including, but not limited to, energy conservation, increased comfort, and/or potential utility cost savings. In some instances, the HVAC system configuration for the building 2 that is developed by the remote system 36 may include an ability to order one or more HVAC components 6 of the developed HVAC system via the user interface 46.

In operation, a method of developing an HVAC system configuration for an HVAC system of a building may include accepting building information via a user interface of a computing device, where the accepted information at least partially defines or provides access to information defining an inner structure of at least part of the building. Such information may include current HVAC system configuration information for the HVAC system of the building. In one instance, the current HVAC system configuration information may include, among other information, a current location of one or more register vents within the building. Based, at least in part, on the accepted building information, a processor may determine one or more suggested HVAC system configuration for the building and the suggested one or more HVAC system configurations may be displayed via the user interface. In some cases, a suggested HVAC system configuration may be accepted or rejected and products for implementing an accepted suggested HVAC system configuration may be purchased via the user interface.

Figure 6:
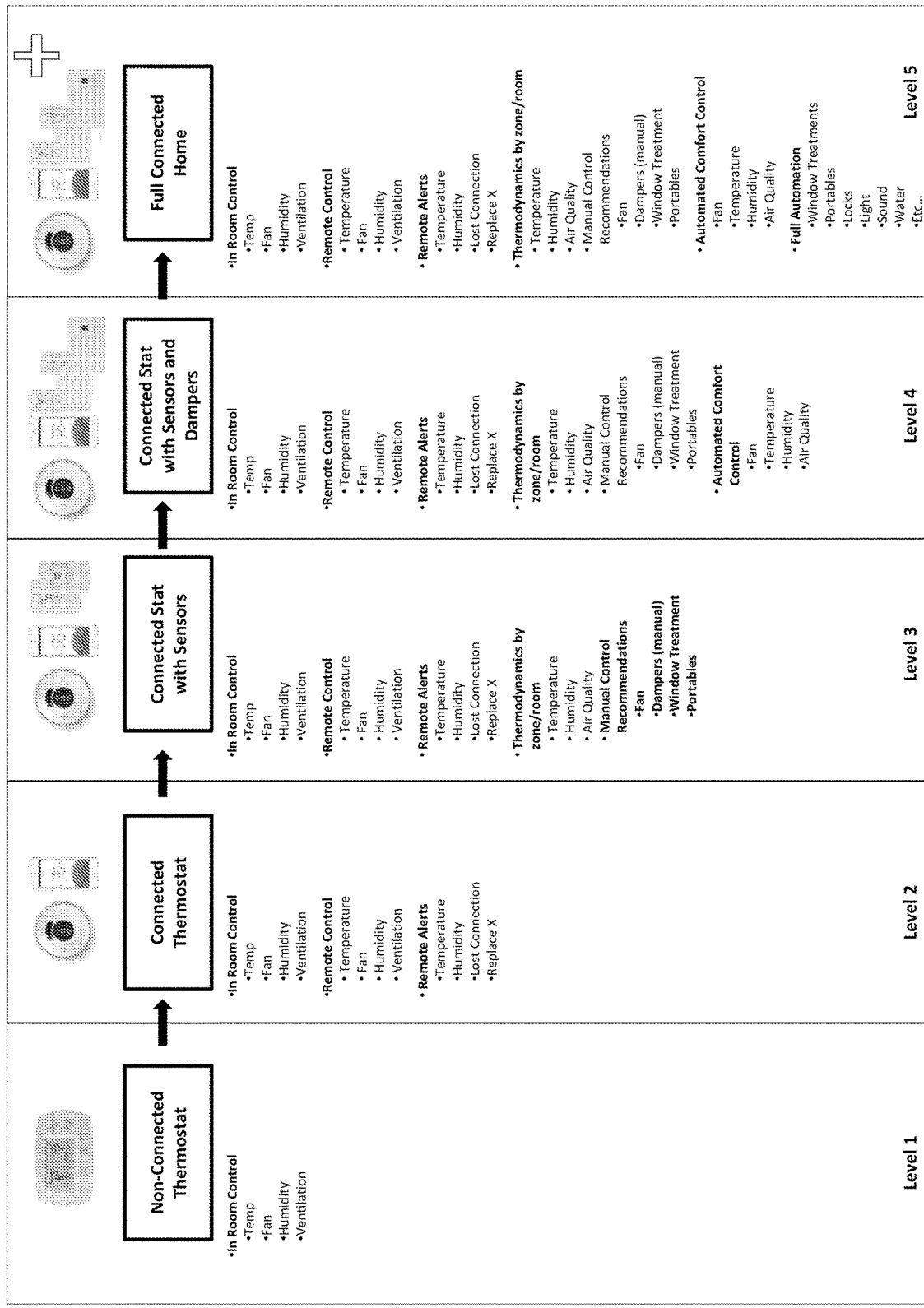
FIG. 6 is a schematic diagram of illustrative components of various levels of HVAC system configurations.

FIG. 6 depicts example features that may be included in various levels of HVAC configurations that the remote system 36 or other device may develop for a modeled spaced. For example, LEVEL 1 may include a typical thermostat (e.g., a building automation controller 18) that may allow for control of temperature, fan operation, humidity, and/or ventilation of an HVAC system. LEVEL 2 may include an internet connected thermostat (e.g., a thermostat that may be able to access the remote system 36 and/or wired or wirelessly connected local devices 56), all of the features of LEVEL 1, remote control of the thermostat from a computing device (e.g., mobile phone, laptop computer, desktop computer, tablet computer, etc.), alerts to the thermostat and/or a computing device (e.g., remote alerts), where the alerts may include, but are not limited to, temperature alerts if temperature in a space increases above or decreases below one or more threshold levels, humidity alerts if humidity in a space increases above or decreases below one or more threshold levels, connection lost alerts if the thermostat loses internet connection, and/or replacement alerts if an HVAC component 6 needs replacement (e.g., filter replacement alerts, etc.). LEVEL 3 may include an internet connected thermostat, remote control of the thermostat from a computing device, wired or wireless space/zone sensors, all of the features of LEVEL 2, along with the ability for the thermostat (or a remote system 36 connected to the thermostat) to perform thermodynamics by one or more rooms and/or spaces of a building 2. The thermodynamics analyses may analyze, among other parameter data, temperature data, humidity data, air quality data, etc., and provide recommendations for HVAC component 6 settings, including, but not limited to manually implemented settings for fans, dampers 24 (e.g., duct-line dampers and/or vent dampers 30), window treatments, and/or various other devices that may affect comfort level conditioning in the monitored zones or spaces and may be manually adjustable. LEVEL 4 may include an internet connected thermostat, remote control of the thermostat from a computing device, wired or wireless space/zone sensors, vent dampers 30, all of the features of LEVEL 3, along with automated comfort control of fan operation, temperature, humidity, air quality, and/or other comfort level conditioning affecting parameters. With LEVEL 4 the thermodynamics analyses may be utilized to selectively and/or automatically establish set points and/or control over the fan operation, temperature set points, humidity set points, air quality control components, and/or other components configured to affect comfort level conditions of the zones or spaces. LEVEL 5 may include an internet connected thermostat, remote control of the thermostat from a computing device, wired or wireless space/zone sensors, vent dampers 30, automation of one or more local devices 56 (e.g., window treatments, windows, portable heating/cooling components, locks, lights, sound, water faucets, refrigerators, stoves, ovens, etc.), and all of the features of LEVEL 4. The thermodynamics analyses in a LEVEL 5 system may be utilized to selectively and/or automatically establish set points and/or control over local devices 56 including, but not limited to, window treatments, windows, portable heating/cooling components, locks, lights, sound, water faucets, refrigerators, stoves, ovens, etc.

Although examples of five levels of HVAC system configuration components are described above, other components may be included or excluded at any of the levels of HVAC system configurations in view of a modeled space to be comfort level conditioned and/or in view of other considerations. For example, if a space is already conditioned based on components of a LEVEL 3 configuration described above, a level 3 configuration may be a baseline configuration and one or more levels (e.g., 1, 2, 3, 4, 5, 10, 20, and so on) of HVAC system configuration components may be provided to a user that may be used to incrementally decrease energy consumption. Illustratively, if a space is already conditioned with an HVAC system configuration that is substantially completely automated, a suggested next level of HVAC system configuration componentry may include suggesting a user utilize renewable energy to reduce energy consumption by the HVAC system configuration through incorporating one or more of solar panels, geothermal heating/cooling, etc. into the HVAC system configuration of the comfort level conditioned space. In some cases, a plurality of HVAC system configuration options are provided, sorted by the expected cost/benefit for each option.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed.

What is claimed is:

1. An HVAC control system for controlling an HVAC system of a building, the HVAC system including one or more HVAC components for providing conditioned air to one or more HVAC ducts of the building and a plurality of register vents for controlling delivery of the conditioned air from the one or more HVAC ducts into the building, each of two or more of the register vents is associated with a corresponding electronically controllable register vent damper that is configured to electronically control a damper opening size of the electronically controllable register vent damper in accordance with a damper setting, the HVAC control system comprising:

a communications block for receiving the one or more requests for conditioned air issued by the two or more electronically controllable register vent dampers;

a controller operatively coupled to the communications block, the controller configured to receive the one or more requests for conditioned air via the communications block, and in response:

determine a damper setting for at least one of the two or more electronically controllable register vent dampers based, at least in part, on the damper setting for another one or more of the two or more electronically controllable register vent dampers such that a sum of the damper opening sizes of the two or more electronically controllable register vent dampers remains above a minimum damper opening size threshold when the fan is activated to help prevent excessive load on the fan;

communicate the determined damper setting to the at least one of the two or more electronically controllable register vent dampers through the communications block;

determine which of the one or more of the HVAC components of the HVAC system should be active, if any; and provide one or more control signals to activate or keep active the one or more HVAC components that are determined to be active.

2. The HVAC control system of claim 1, wherein the communications block comprises a wireless interface.

3. The HVAC control system of claim 2, wherein one or more of the two or more electronically controllable register vent dampers comprise a wireless interface for communicating requests for conditioned air to the wireless interface of the communications block.

4. The HVAC control system of claim 1, wherein the one or more HVAC components that are determined to be active comprises a fan of a forced air HVAC system.

5. The HVAC control system of claim 1, wherein the one or more HVAC components that are determined to be active comprises a ventilation unit for bringing in outside air into the building and exhausting inside air from the building.

6. The HVAC control system of claim 1, wherein the one or more HVAC components that are determined to be active comprises one or more of a humidifier and a dehumidifier.

7. The HVAC control system of claim 1, wherein the one or more HVAC components that are determined to be active comprises a hydronic unit.

8. The HVAC control system of claim 1, wherein the one or more HVAC components that are determined to be active comprises one or more of a forced air furnace and an air conditioner.

9. The HVAC control system of claim 1, wherein the one or more HVAC components that are determined to be active comprises one or more of a an electric heater, a fireplace, a portable electric fan, a ceiling fan, a hydronic conditioning unit, and a floor heater.

10. The HVAC control system of claim 8, wherein the HVAC system comprises one or more sensors configured to sense one or more local conditions in the building and provide a measure of the one or more sensed local conditions to the controller via the communications block.

11. The HVAC control system of claim 10, wherein the one or more local conditions comprises one or more of temperature, humidity, radiant heat, CO2 concentration and VOC (Volatile Organic Compound) concentration.

12. The HVAC control system of claim 10, wherein:
the one or more sensed local conditions comprises one or more air quality conditions; and
the controller is configured to determine settings for one or more air quality components of the HVAC system based, at least in part, on provided measures of the one or more air quality conditions.

13. The HVAC control system of claim 1, wherein the building further includes one or more non-HVAC components that can contribute to comfort in the building, and wherein the controller is further configured to control one or more of the non-HVAC components via the communications block.

14. The HVAC control system of claim 1, wherein at least one of the register vents has a manually controllable register vent damper that has a manually set damper setting, and wherein the controller is configured to determine the damper setting for at least one of the two or more electronically controllable register vent dampers based, at least in part, on a consideration of the manual set damper setting of at least one manually controllable register vent damper.

15. The HVAC control system of claim 1, wherein the HVAC system of the building is a zoned HVAC system, and wherein at least one of the two or more electronically controllable register vent dampers is in a first zone and at least one other of the two or more electronically controllable register vent dampers is in a second zone, and wherein the controller is configured to control the first zone differently from the second zone.

16. An HVAC control system for controlling a forced air conditioning system of a building, wherein the building includes a duct for carrying air of the forced air conditioning system and a plurality of register vents in fluid communication with a duct, wherein each of two or more of the register vents includes a corresponding electronically controllable register vent damper that is configured to electronicallt control a damper opening size of the electronically controllable register vent damper in accordance with a damper setting, the HVAC control system comprising:
two or more sensors configured to sense environmental parameters at two or more different locations in the building, wherein at least one of the two or more sensors is configured to sense an environmental parameter other than temperature;
a controller in operative communication with the two or more sensors, the two or more electronically controllable register vent dampers, and one or more HVAC components of the forced air conditioning system;
the controller is further configured to control the one or more HVAC components of the forced air conditioning system and a damper setting of at least one of the two or more electronically controllable register vent dampers based, at least in part, on:
the sensed environmental parameter other than temperature; and
a damper setting for another one or more of the two or more electronically controllable register vent dampers such that a sum of damper opening sizes of the two or more electronically controllable register vent dampers remains above a minimum damper opening size threshold when the fan is activated to help prevent excessive load on the fan.

17. The HVAC control system of claim 16, wherein the environmental parameter other than temperature of at least one of the two or more sensors is humidity, CO2 concentration, or VOC concentration.

18. The HVAC control system of claim 16, wherein the controller is configured to:
store values of the sensed environmental parameter other than temperature in a cloud server;
control the one or more HVAC components and the damper setting of at least one of the two or more electronically controllable register vent dampers based, at least in part, on stored values of the sensed environmental parameters other than the temperature.

19. The HVAC control system of claim 18, wherein the controller is configured to:
receive a request for data related to the sensed environmental parameter other than temperature; and
provide a report for the data related to the sensed environmental parameter other than temperature based, at least in part, on the stored values of the sensed environmental parameter other than temperature.

20. The HVAC control system of claim 16, wherein:
the forced air conditioning system is a zoned system with at least one of the two or more electronically controllable register vent dampers is in a first zone and at least one other of the two or more electronically controllable register vent dampers is in a second zone;
at least one of the two or more sensors is in the first zone and at least one other of the two or more sensors is in the second zone; and
the controller is configured to control the first zone differently from the second zone.

21. An HVAC control system for controlling a zoned HVAC system of a building, the zoned HVAC system including one or more HVAC components for providing conditioned air to one or more HVAC ducts of the building and a plurality of electronically controllable register vent dampers for controlling delivery of the conditioned air from the one or more HVAC ducts into each of two or more zones of the building, each of the two or more zones of the building having at least one sensor for sensing a sensed condition in the corresponding zone, the HVAC control system comprising:
a communications block for receiving a measure related to the sensed condition from each of the two or more sensors;
a controller operatively coupled to the communications block, the controller configured to receive the measures related to the sensed condition from each of the two or more sensors via the communications block, and in response:
electronically control a damper opening size of each of the plurality of electronically controllable register vent dampers in accordance with a damper setting;
determine a damper setting for at least one of the plurality of electronically controllable register vent dampers based, at least in part, on a damper setting for another one or more of the plurality of electronically controllable register vent dampers such that a sum of damper opening sizes of the plurality of electronically controllable register vent dampers remains above a minimum damper opening size threshold when the fan is activated to help prevent excessive load on the fan;
communicate the determined damper setting for the at least one of the plurality of electronically controllable register vent dampers to the communications block;

determine which of the one or more of the HVAC components of the HVAC system should be active, if any; and provide one or more control signals to activate or keep active the one or more HVAC components that are determined to be active, if any.

* * * * *

UNITED STATES PATENT AND TRADEMARK OFFICE
CERTIFICATE OF CORRECTION

| | |
|---|---|
| PATENT NO. | : 10,915,669 B2 |
| APPLICATION NO. | : 14/745073 |
| DATED | : February 9, 2021 |
| INVENTOR(S) | : James Flaherty, Nathaniel D. Kraft and Preston Gilmer |

It is certified that error appears in the above-identified patent and that said Letters Patent is hereby corrected as shown below:

In the Claims

Column 24, Line 36 (Claim 3): Replace "...dampers comprise a wireless..." with --...dampers are in communication with a wireless...--

Column 25, Line 39-40 (Claim 16): Replace "...electronicallt control..." with --...electronically control...--

Signed and Sealed this
Thirty-first Day of May, 2022

Katherine Kelly Vidal
*Director of the United States Patent and Trademark Office*